US011943938B2

(12) United States Patent
Fantini et al.

(10) Patent No.: US 11,943,938 B2
(45) Date of Patent: Mar. 26, 2024

(54) METHOD FOR MANUFACTURING A MEMORY DEVICE AND MEMORY DEVICE MANUFACTURED THROUGH THE SAME METHOD

(71) Applicant: Micron Technology, Inc., Boise, ID (US)

(72) Inventors: Paolo Fantini, Vimercate (IT); Lorenzo Fratin, Buccinasco (IT); Paolo Tessariol, Arcore (IT)

(73) Assignee: Micron Technology, Inc., Boise, ID (US)

( * ) Notice: Subject to any disclaimer, the term of this patent is extended or adjusted under 35 U.S.C. 154(b) by 474 days.

(21) Appl. No.: 17/252,357

(22) PCT Filed: Mar. 18, 2020

(86) PCT No.: PCT/IB2020/000102
§ 371 (c)(1),
(2) Date: Dec. 15, 2020

(87) PCT Pub. No.: WO2021/186199
PCT Pub. Date: Sep. 23, 2021

(65) Prior Publication Data
US 2022/0051944 A1    Feb. 17, 2022

(51) Int. Cl.
*H10B 99/00*    (2023.01)
*H01L 21/768*    (2006.01)

(52) U.S. Cl.
CPC ....... *H10B 99/00* (2023.02); *H01L 21/76802* (2013.01); *H01L 21/76877* (2013.01)

(58) Field of Classification Search
CPC ...... H10B 63/84; H10B 63/845; H10B 63/00; H10B 63/10; H10B 63/30; H10B 63/34;
(Continued)

(56) References Cited

U.S. PATENT DOCUMENTS 9,876,055 B1 * 1/2018 Chen ................... H10N 70/066
2016/0027505 A1    1/2016 Park
(Continued)

FOREIGN PATENT DOCUMENTS

KR    10-2012-0120537 A    11/2012
TW    201442311 A    11/2014
WO    2019-095996 A1    5/2019

OTHER PUBLICATIONS

Office Action from related Taiwan Patent Application No. 110106880, dated Mar. 28, 2022, 18 pages.
(Continued)

*Primary Examiner* — Thanhha S Pham
(74) *Attorney, Agent, or Firm* — Brooks, Cameron & Huebsch, PLLC

(57) ABSTRACT

A method for manufacturing a 3D vertical array of memory cells is disclosed. The method comprises:
forming on a substrate a stack of dielectric material layers comprising first and second dielectric material layers alternated to each other;
forming holes through the stack of dielectric material layers, said holes exposing the substrate;
selectively removing the second material layers through said holes to form cavities between adjacent first dielectric material layers;
filling said cavities with a conductive material through said holes to form corresponding conductive material layers;
forming first memory cell access lines from said conductive material layers;
carrying out a conformal deposition of a chalcogenide material through said holes;
forming memory cell storage elements from said deposited chalcogenide material;
(Continued)

filling said holes with conductive material to form corresponding second memory cell access lines.

16 Claims, 29 Drawing Sheets

(58) Field of Classification Search
CPC ... H10B 63/80; H10B 63/82; H01L 21/76802; H01L 21/76877
See application file for complete search history.

(56) References Cited

U.S. PATENT DOCUMENTS

| | | |
|---|---|---|
| 2016/0126292 A1 | 5/2016 | Yanagida et al. |
| 2019/0115391 A1 | 4/2019 | Nardi et al. |
| 2020/0168792 A1* | 5/2020 | Song .................. G11C 13/0097 |

OTHER PUBLICATIONS

International Search Report and Written Opinion from related International Application No. PCT/IB2020/000102, dated Dec. 3, 2020, 12 pages.

* cited by examiner

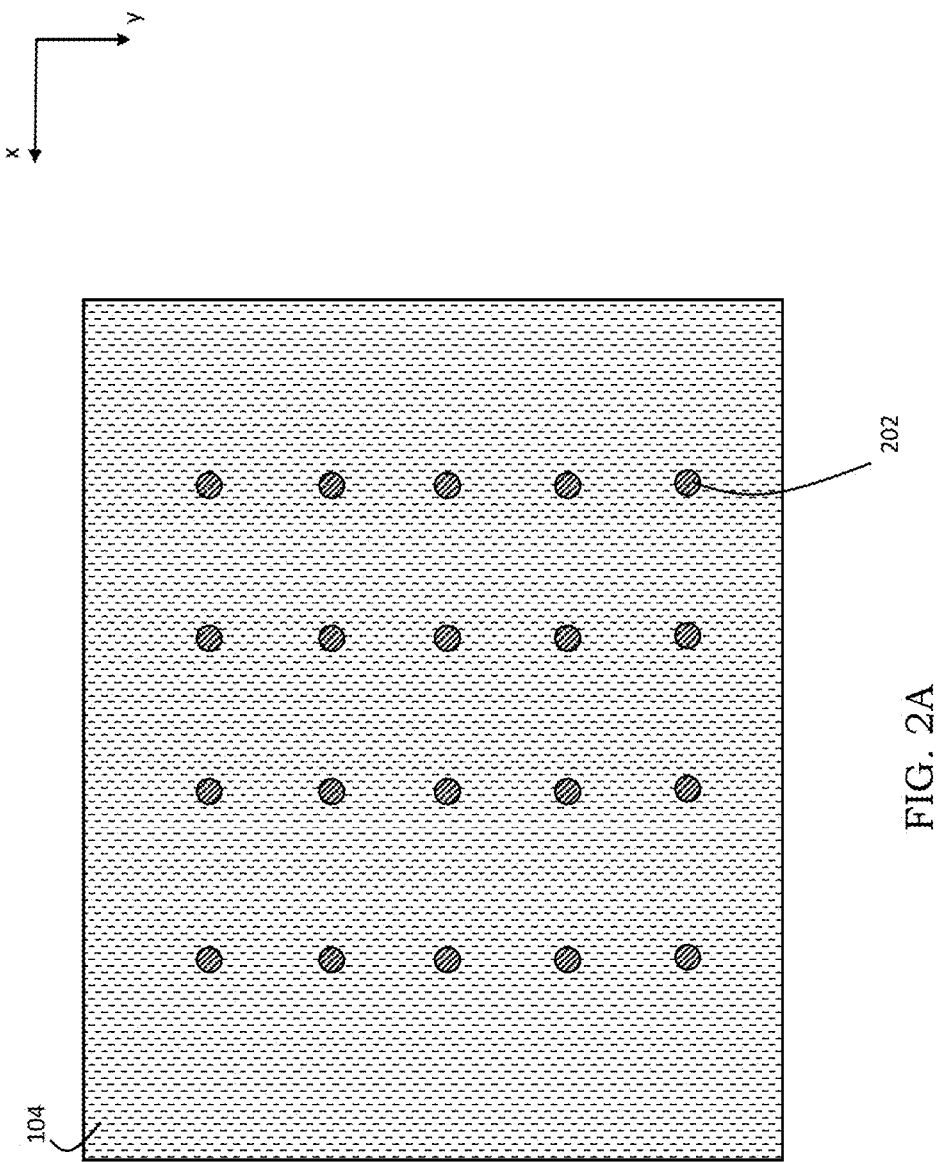

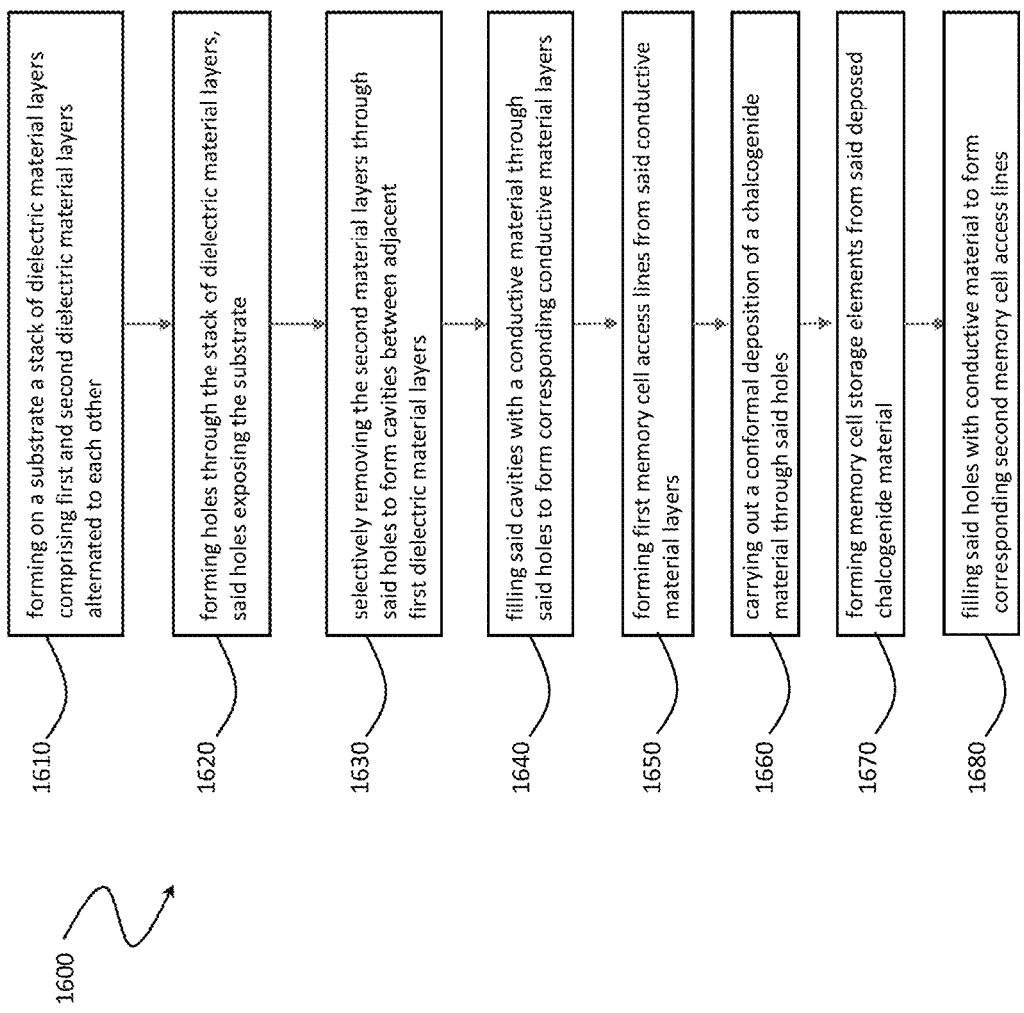

US 11,943,938 B2

METHOD FOR MANUFACTURING A MEMORY DEVICE AND MEMORY DEVICE MANUFACTURED THROUGH THE SAME METHOD

PRIORITY INFORMATION

This application is a U.S. National Stage Application under 35 U.S.C. § 371 of International Application Number PCT/IB2020/000102, filed on Mar. 18, 2020, the contents of which are incorporated herein by reference.

BACKGROUND OF THE INVENTION

The present invention relates to the field of electronics, and more specifically to a method for manufacturing an electronic memory device and to a memory device manufactured using the method.

Electronic memory devices (hereinafter, briefly referred to as "memory devices") are widely used to store data in various electronic devices such as tablets, computers, wireless communication devices (e.g., smartphones), cameras, digital displays, and the like.

Memory devices comprise a plurality of memory cells arranged in one or more arrays of memory cells, or memory arrays. Each memory cell is adapted to store data in the form of programmable logic states. For example, binary memory cells can be programmed into two different logic states, often denoted by a logic "1" (also referred to as "SET" state) or a logic "0" (also referred to as "RESET" state). In other systems, more than two logic states may be stored. To access the stored data, a module/unit of the electronic device may read, or sense, the stored logic state in the memory device. To store data, a module/unit of the electronic device may write, or program, the logic state in the memory device.

Memory devices may be of the non-volatile type or may be of the volatile type. A non-volatile memory device comprises memory cells that are capable of retaining the stored data by maintaining their programmed logic state for extended periods of time even in the absence of an external power source. A volatile memory device comprises memory cells that may lose their stored data over time unless they are periodically refreshed by an external power source.

Several kinds of non-volatile memory devices are known in the art, a non-exhaustive list thereof comprising read-only memory devices, flash memory devices, ferroelectric Random Access Memory (RAM) devices, magnetic memory storage devices (such as for example hard disk drives), optical memory devices (such as for example CD-ROM disks, DVD-ROM disks, Blu-ray disks), Phase Change Memory devices (PCM), other chalcogenide-based memories, and others.

Memory devices having a vertical three-dimensional (3D) architecture are known, comprising a 3D vertical memory array comprising in turn a plurality of (e.g., 64) two-dimensional (2D) memory arrays (also referred to as "memory decks") vertically stacked to each other so as to form a corresponding plurality of levels of memory cells stacked to each other.

BRIEF DESCRIPTION OF THE DRAWINGS

FIGS. 2A, 2B, illustrate a first phase of a method for manufacturing a 3D vertical memory array corresponding to the 3D vertical memory array 100 of FIG. 1 in accordance with embodiments of the present disclosure;

FIG. 16 illustrates a diagram showing the step of the method of the present disclosure.

DETAILED DESCRIPTION

Figure 1:
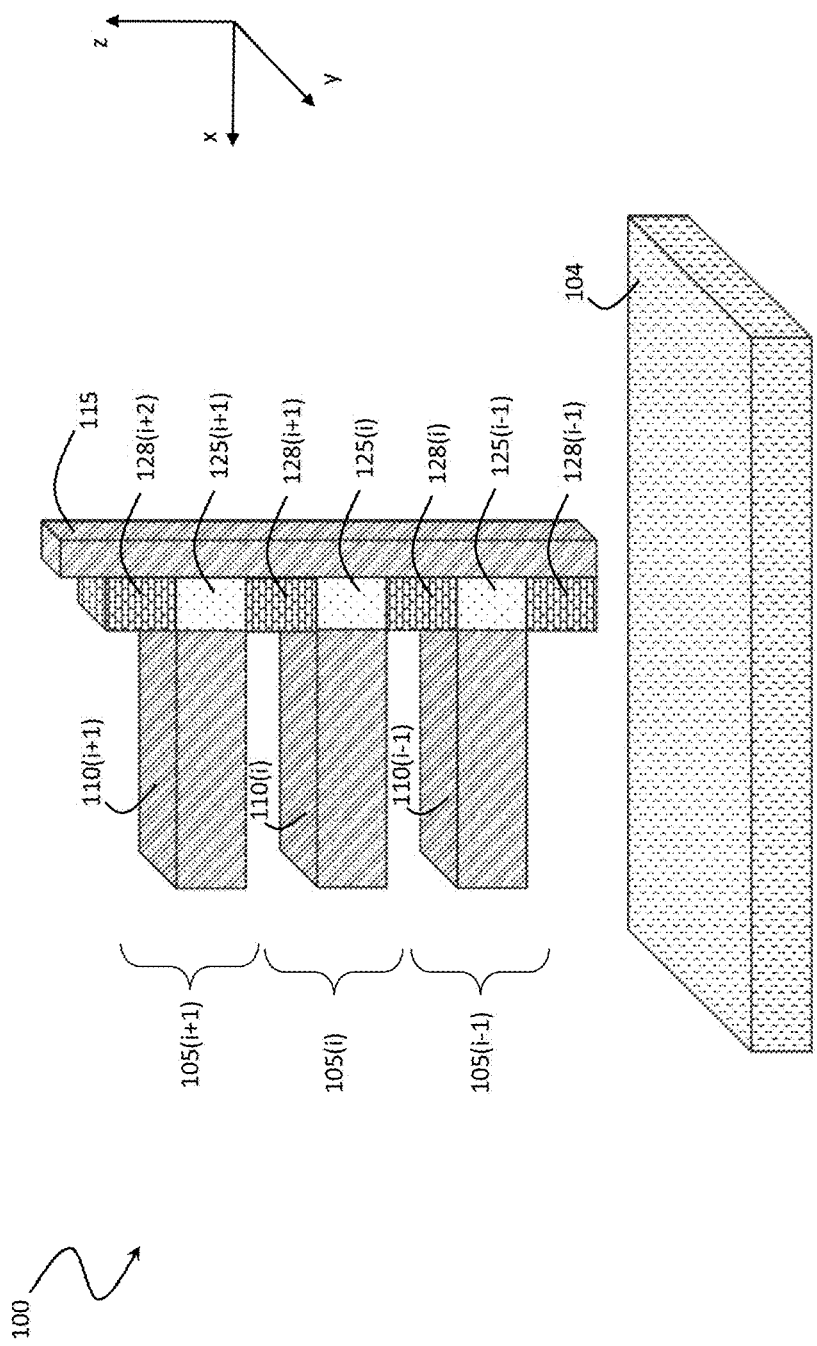
FIG. 1 illustrates an example of a portion of a 3D vertical memory array 100 in accordance with embodiments of the present disclosure.

In the following detailed description, reference is made to the accompanying drawings that form a part hereof and in which is shown, by way of illustration, specific embodiments. In the drawings, like numerals describe substantially similar components throughout the several views. Other embodiments may be disclosed and structural, logical, and electrical changes may be made without departing from the scope of the present disclosure. The following detailed description is, therefore, not to be taken in a limiting sense.

The present disclosure relates to a method method for manufacturing an electronic memory device and to a memory device manufactured using the method.

The memory device of the present disclosure is a non-volatile memory device. For instance 3D vertical memory array, that has been realized as an independent die with a specific lithography process.

In some examples, a 3D memory array may include a substrate with a plurality of contacts arranged in a pattern (e.g., a geometric pattern) and a first insulative material (e.g., a dielectric material) formed on the substrate. A plurality of planes of a conductive material may be separated from one another by a second insulative material (e.g., a dielectric material) and formed on the substrate material. The planes of conductive material may be examples of word lines.

A cross-point memory array is a 3D vertical memory array having memory cells formed at a topological cross-point between a first conductive access line (e.g., word line) and a second conductive access line (e.g., digit line).

This 3D architecture allows to advantageously increase the number of memory cells that may be placed or created on a single die or substrate as compared with 2D architectures.

This 3D architecture may thus reduce production costs, or increase the performance of the memory device, or both.

Cross-point memory arrays may be manufactured by forming a stack of alternating layers of conductive materials (e.g., tungsten or molybdenum) and dielectric, insulating materials (e.g., silicon dioxide) on a substrate with a plurality of contacts. A plurality of vertically stacked 2D memory arrays is formed in which each 2D memory array is associated with a corresponding conductive material layer. For each 2D memory array, first access lines (e.g., word lines) are formed from the associated conductive material layer, and memory cell data storage elements (e.g., phase-change material elements) are formed contacting said first access lines. Second access lines (e.g., digit lines) in the form of conductive pillars are formed that vertically cross the alternating layers of conductive materials and dielectric materials until contacting the contacts on the substrate. Therefore, a (storage element of a) memory cell of a 2D memory array can be accessed (e.g., for programming or reading the logic state thereof) through a first access line (word line) obtained from the associated conductive material layer, and through a second access line (e.g., digit line) corresponding to a conductive pillar.

In order to form the first access lines, the storage elements and the conductive pillars of this 3D vertical arrangement, the manufacturing process thereof requires the formation of trenches crossing the stack of alternating layers of conductive materials and dielectric materials until reaching the substrate. In order to form these trenches, selective etching operations are performed to selectively remove portions of the stack of alternating layers of conductive materials and dielectric materials until reaching the substrate.

However, as the number of vertically stacked layers of conductive materials and dielectric materials is increased (e.g., above 64), the abovementioned selective etching operations become more difficult to be carried out. Indeed, etching a portion of a layer of a conductive material such as tungsten or molybdenum requires the application of an etching agent for a non negligible amount of time. When the number of vertically stacked layers is too high, the mask used for the selective etching operation can be consumed before the complete formation of the trench.

Other conductive materials which can be etched in an easier way, such as the polysilicon used in the floating gate NAND memory technology, could be used as conductive layers for forming the 3D vertical memory arrays of the cross-point type. However, their higher resistivity causes the memory device to be affected by a disadvantageous latency increase.

Solutions used for manufacturing vertical 3D NAND memory devices based on the so-called Replacement Gate architecture, try to solve this drawback by forming on the substrate a stack of alternating layers of two different dielectric (insulating) materials (e.g., silicon dioxide layers and silicon nitride layers) instead of forming a stack of alternating layers of conductive materials and dielectric materials. According to this solution, the layers made in one of the two dielectric materials (e.g., the silicon nitride layers) are sacrificial layers, adapted to be replaced by layers of a conductive material in a subsequent time.

Then, trenches are generated in the stacked layers of the two dielectric materials by means of etching, and memory cells and conductive pillars are formed. A plurality of slits are then etched through the stacked layers of the two dielectric materials, for example a slit every four lines of conductive pillars, and etchant is applied through the opened slits for selectively removing the sacrificial layers. The slits are then exploited for filling the empty spaces left by the removed sacrificial layers with a conductive material (such as tungsten) to be used for forming word lines.

The abovementioned method for manufacturing vertical 3D NAND memory devices based on the Replacement Gate architecture is affected by the drawback of requiring the formation of dedicated slits for the removal of the sacrificial layers, which negatively increase the area occupation of the resulting memory device. Moreover, this method is not suitable for being used for manufacturing 3D vertical memory arrays of the cross-point type, since it provides for the replacement of the sacrificial layers with conductive material only after the formation of the conductive pillars and of the memory cells.

In view of the above, the applicant has devised a solution for manufacturing a memory device comprising a 3D vertical memory array, particularly a 3D vertical memory array of the cross-point type which is not affected by the drawbacks of the solutions known in the art.

With particular reference to the figures, which all share the same reference system identified by the three orthogonal directions x, y and z, FIG. 1 illustrates an example of a portion of a 3D vertical memory array 100 in accordance with embodiments of the present disclosure. The 3D vertical memory array 100 comprises one or more, preferably a plurality, 2D arrays (or decks) 105($i$) ($i$=1, 2, . . . ) of memory cells stacked to each other along a direction parallel to direction z above a substrate 104 (e.g., made of or comprising dielectric material) extending parallel to direction x and y. In the exemplary 3D vertical memory array 100 portion illustrated in FIG. 1, portions of only three decks of memory cells are visible, namely a generic deck 105($i$) and the two adjacent decks 105($i$−1) and 105($i$+1), wherein the deck 105($i$−1) is below the deck 105($i$) and the deck 105($i$+1) is above the deck 105($i$).

The 3D vertical memory array 100 includes for each deck 105($i$) associated word lines 110($i$), extending substantially parallel to the substrate 104 at a corresponding distance (along direction z) with respect to the substrate 104.

The 3D vertical memory array 100 include also digit lines 115 in the form of conductive pillars, only one being depicted in the figure, extending substantially perpendicular to the substrate 104 (i.e., extending along direction z).

Memory cells of the decks 105(i) may comprise self-selecting memory cells.

Each memory cell of each deck 105(i) comprises a data storage element 125(i), made in, or comprising, a storage element material, such as a chalcogenide material, for example a chalcogenide alloy and/or glass, that may serve as a self-selecting data storage element material, i.e., a material that may serve as both a select device and a data storage element.

The architecture of 3D vertical memory array 100 may be referred to as a cross-point architecture, in which a memory cell is formed at a topological cross-point between a word line 110(i) and a digit line 115, with the generic data storage element 125(i) that contacts a corresponding word line 110(i) associated to the deck 105(i) and a corresponding digit line 115. Such a cross-point architecture may offer relatively high-density data storage with lower production costs compared to other memory architectures. For example, the cross-point architecture may have memory cells with a reduced area and, resultantly, an increased memory cell density compared to other architectures.

According to this architecture, memory cells belonging to a generic deck 105(i) are vertically stacked (along direction z) above the memory cells of the underlying deck 105(i−1), with the data storage elements 125(i) that are located above the data storage elements 125(i−1) and are electrically insulated from the latter by means of a dielectric (insulating) material portion 128(i) located between the data storage elements 125(i) and 125(i−1).

The substrate 104 may comprise a plurality of contacts (not visible in FIG. 1) arranged in a grid or staggered pattern. For example, the plurality of contacts may extend through the substrate 104 and couple with access lines of the memory array 100, such as the digit lines 115.

Memory cells may be accessed through selected word line(s) 110(i) and selected digit line(s) 115 for receiving program and/or read pulses.

The generic data storage element 125(i) may be responsive to an applied voltage, such as a program pulse. For an applied voltage that is less than a threshold voltage, the data storage element 125(i) may remain in an electrically non-conductive state, corresponding for example to a "RESET" state (or logic "0"). Responsive to an applied voltage that is greater than the threshold voltage, the data storage element 125(i) may enter an electrically conductive state, corresponding for example to a "SET" state (or logic "1").

The data storage element 125(i) may be programmed to a target logic state by applying a pulse (e.g., a program pulse) that satisfies a programming threshold. The amplitude, shape, or other characteristics of the program pulse may be configured to cause the data storage element 125(i) to exhibit the target logic state. For example, after applying the program pulse, the ions of the data storage element 125(i) may be redistributed throughout the data storage element 125(i), thereby altering a resistance of the memory cell detected when a read pulse is applied. In some cases, the threshold voltage of the data storage element 125(i) may vary based on applying the program pulse. In other embodiments, the data storage element 125(i) may be programmed to a target logic state by one or more pulses of a positive or a negative polarity applied to the selected word line 110(i) and bit line (115).

The logic state stored by the data storage element 125(i) may be sensed, detected, or read by applying read pulse to the storage element 125(i). The amplitude, shape, or other characteristics of the read pulse may be configured to allow a sense component to determine what logic state is stored in the data storage element 125(i). For example, in some cases, the amplitude of the read pulse is configured to be at a level that the data storage element 125(i) will conduct (e.g., current is conducted through the material) for a first logic state such as the "SET" state (or logic "1"), but will be not conductive (e.g., little to no current is conducted through the material) for a second logic state such as the "RESET" state (or logic "0").

In some cases, the polarity of the pulse (whether program pulse or read pulse) applied to the data storage element 125(i) may affect the outcomes of the operation being performed. For example, a read pulse of a first polarity may result in the data storage element 125(i) exhibiting a first logic state while a read pulse of a second polarity may result in the data storage element 125(i) exhibiting a second, different logic state. This may occur because of the asymmetrical distributions of ions or other material in the data storage element 125. Similar principles apply to program pulses and other pulses or voltages.

Examples of chalcogenide materials that may serve as the data storage element 125(i) include indium(In)-antimony (Sb)-tellurium(Te) (IST) materials, such as In2Sb2Te5, In1Sb2Te4, In1Sb4Te7, etc., and germanium(Ge)-antimony (Sb)-tellurium(Te) (GST) materials, such as Ge8Sb5Te8, Ge2Sb2Te5, Ge1Sb2Te4, Ge1Sb4Te7, Ge4Sb4Te7, or etc., among other chalcogenide materials, including, for instance, alloys that do not change phase during the operation (e.g., selenium-based chalcogenide alloys). Further, the chalcogenide material may include minor concentrations of other dopant materials. Other examples of chalcogenide materials may include tellurium-arsenic (As)-germanium (OTS) materials, Ge, Sb, Te, silicon (Si), nickel (Ni), gallium (Ga), As, silver (Ag), tin (Sn), gold (Au), lead (Pb), bismuth (Bi), indium (In), selenium (Se), oxygen (O), Sulphur (S), nitrogen (N), carbon (C), yttrium (Y), and scandium (Sc) materials, and combinations thereof. The hyphenated chemical composition notation, as used herein, indicates the elements included in a particular mixture or compound, and is intended to represent all stoichiometries involving the indicated elements. In some examples, the chalcogenide material may be a chalcogenide glass or amorphous chalcogenide material. In some example, a chalcogenide material having primarily selenium (Se), arsenic (As), and germanium(Ge) may be referred to as SAG-alloy.

In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms. In some examples, conductivity may be controlled through doping using various chemical species. For example, doping may include incorporating a Group 3 (e.g., boron (B), gallium (Ga), indium (In), aluminum (Al), etc.) or Group 4 (tin (Sn), carbon (C), silicon (Si), etc.) element into the composition.

A method according to embodiments of the present disclosure for manufacturing a 3D vertical memory array corresponding to the 3D vertical memory array 100 of FIG. 1 will be now described by making reference to FIGS. 2A, 2B, 3A, 3B, 4A, 4B, 5A-5C, 6A, 6B, 7A-7C, 8A-8C, 9A, 9B, 10A, 10B, 11A, 11B and 12.

Figure 2B:
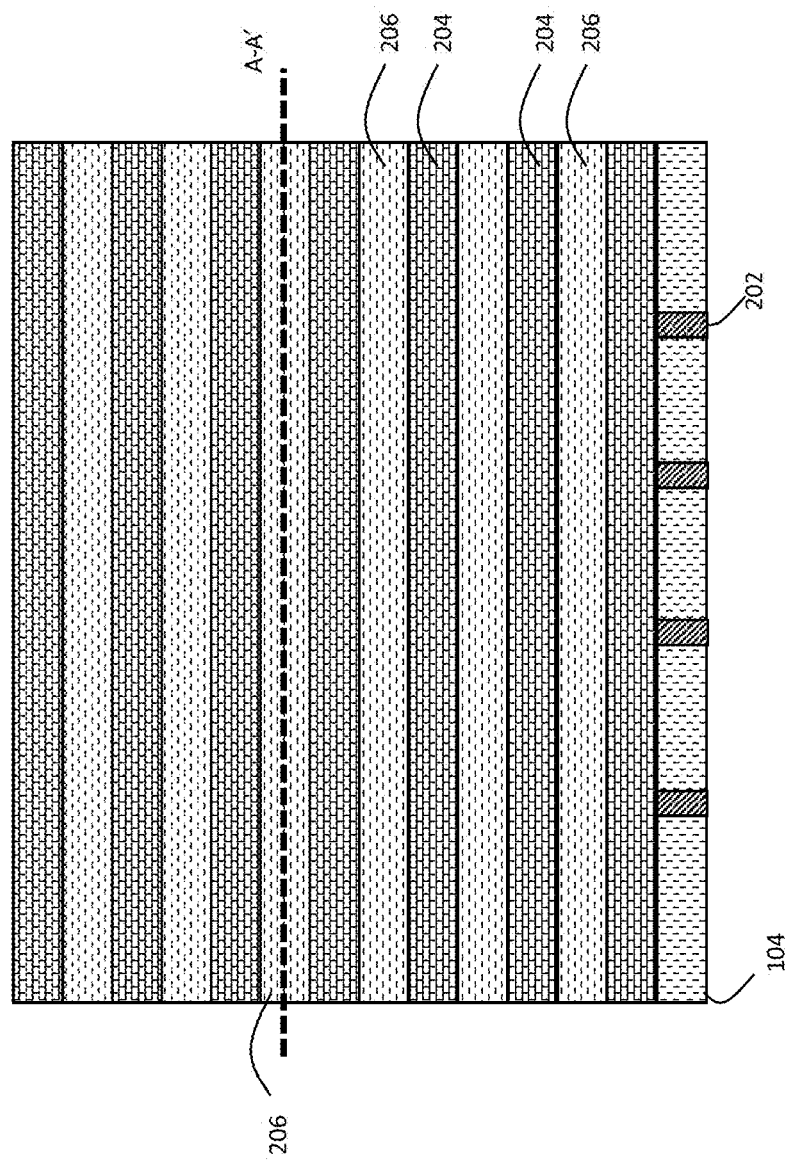

The first phase of the manufacturing method according to embodiments is illustrated in FIGS. 2A and 2B, wherein FIG. 2A is a bottom view of an intermediate (i.e., partially manufactured) 3D vertical memory array taken from a plane parallel to directions x and y, and FIG. 2B is a side view of the same array taken from a plane parallel to directions x and z.

The phase of the method illustrated in FIGS. 2A and 2B comprises providing the substrate 104 made of or comprising dielectric material, and forming a plurality of conductive contacts 202 which extend through the substrate 104.

According to an embodiment, each conductive contact 202 is configured to contact a corresponding digit line (see FIG. 1), for example through a selector transistor (not illustrated). The plurality of conductive contacts 202 may be arranged according to a grid pattern. For example, a conductive contact 202 may be surrounded by up to eight other conductive contacts 202. According to other embodiments, not illustrated, the plurality of conductive contacts 202 may be arranged in a staggered pattern or a hexagonal pattern.

According to an embodiment, this phase of the method further comprises forming on the substrate 104 a stack of alternating layers of two different dielectric (insulating) materials, comprising first dielectric material layers 204 and second dielectric material layers 206. According to an embodiment, the first dielectric material layers 204 comprise silicon dioxide layers and the second dielectric material layers 206 comprise silicon nitride layers. Each first and second dielectric material layer 204, 206 are at a different level (i.e., at a different distance along direction z) with respect to the substrate 104.

According to an embodiment of the present disclosure, the first dielectric material layers 204 and the second dielectric material layers 206 are formed by means of a sequence of deposition operations.

Although seven first dielectric material layers 204 and six second dielectric material layers 206 are illustrated in the figures, it has to be appreciated that concepts according to embodiments of the present disclosure can be applied to a different (e.g., higher) number of layers, such as for example 64.

As will be described in greater detail in the following, according to an embodiment of the present disclosure, the first dielectric material layers 204 will be used for the generation of the dielectric material portions 128(i) between the data storage elements 125(i) and 125(i-1) of memory cells belonging to adjacent decks 105(i), 105(i-1) of the finished 3D vertical memory array 100 (see FIG. 1).

As will be described in greater detail in the following, according to an embodiment, the second dielectric layers 206 are sacrificial layers adapted to be replaced in a subsequent method phase by layers of a conductive material to be used for the formation of the word lines 110(i) associated to the decks 105(i) of the finished 3D vertical memory array 100.

Figure 3A:
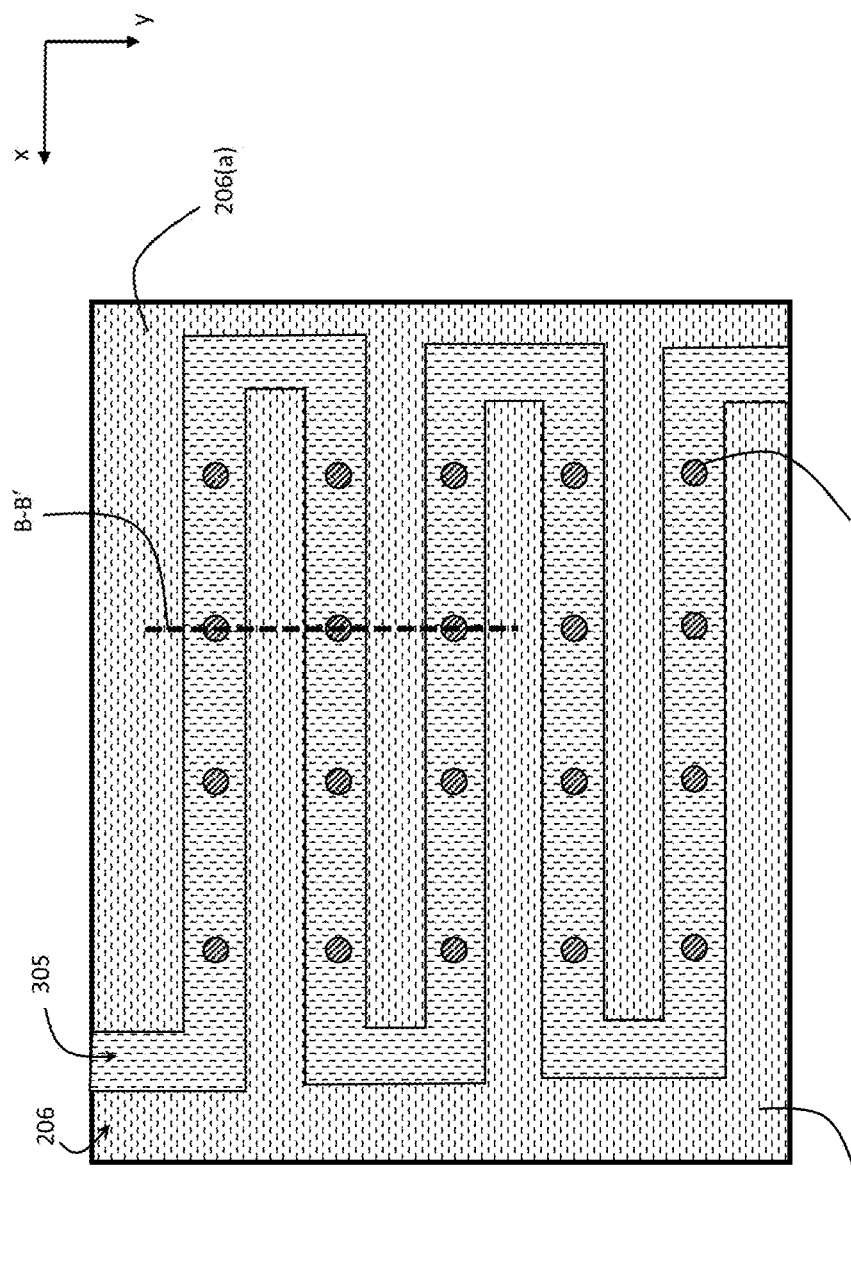
FIGS. 3A, 3B illustrate a second phase of a method for manufacturing a 3D vertical memory array corresponding to the 3D vertical memory array 100 of FIG. 1 in accordance with embodiments of the present disclosure.
Figure 3B:
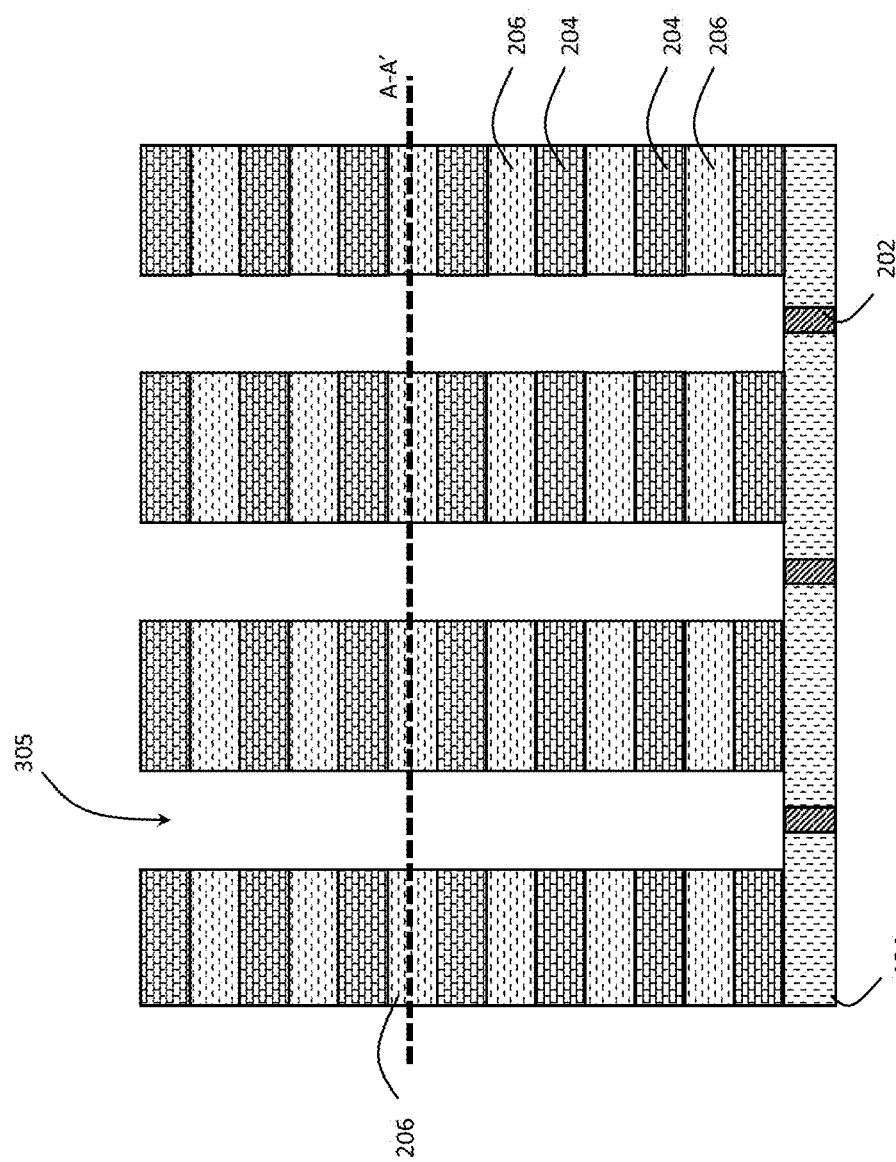

The next phase of the manufacturing method according to embodiments of the present disclosure is illustrated in FIGS. 3A and 3B, wherein FIG. 3A is a section view of an intermediate (i.e., partially manufactured) 3D vertical memory array taken from a section plane A-A' plane parallel to directions x and y and crossing a second dielectric material layer 206, and FIG. 3B is a section view of a portion of the same array taken from a section plane B-B' parallel to directions y and z and crossing three conductive contacts 202.

The phase of the method illustrated in FIGS. 3A and 3B comprises forming a trench 305 through the alternating first and second dielectric material layers 204, 206 until exposing the underlying substrate 104 and the conductive contacts 202.

According to an embodiment of the present disclosure, the trench 305 is formed by means of a selective etching operation exploiting a suitable patterned mask (not illustrated).

Since both the first dielectric material layers 204 and the second dielectric material layers 206 are made of or comprise dielectric materials such as silicon dioxide and silicon nitride, which can be etched more easily compared to conductive materials such as tungsten or molybdenum, the selective etching operation can be expediently carried out even if the number of first and second dielectric material layers 204, 206 is large. Indeed, the etching operation can be carried out in a relatively fast and efficient way, and the underlying substrate 104 can be advantageously exposed before the mask used for the selective etching operation is consumed. As already mentioned above, if instead a large number of conductive material (e.g., molybdenum or tungsten) layers had to be etched, the mask used for the etching operation would consume itself before the etching reached the underlying substrate 104.

According to an embodiment of the disclosure, the trench 305 has a serpentine-like shape view from above. According to an embodiment of the disclosure, the trench 305 may pass over a row of the conductive contacts 202 in a first direction (e.g., parallel to direction x, going from left to right), and then pass over an adjacent row of the conductive contacts 202 in a second direction that is opposite to the first direction (e.g., parallel to direction x, going from right to left). With reference to FIG. 3A, the trench 305 passes over a first row of conductive contacts 202 parallel to direction x from left to right, then "turns" and passes over a next (second) row of conductive contacts 202 (adjacent to the first row of conductive contacts 202 along direction y) parallel to direction x from right to left. The trench 305 then "turns" again and passes over a next (third) row of conductive contacts 202 (adjacent to the second row of conductive contacts 202 along direction y) parallel to direction x from left to right, and so on.

The trench 305 is arranged to bifurcate each first and second dielectric material layers 204, 206 in at least two portions: a first portion 204(a), 206(a) and a second portion 204(b), 206(b)(only the portions 206(a) and 206(b) being visible in FIG. 3A). As will be described in detail the following, according to embodiments of the present disclosure, the (separate) portions 206(a) and 206(b) of each second dielectric material layer 206 will be replaced by corresponding conductive material portions having the same shape, and forming interleaved word lines 110(i) associated to the corresponding deck 105(i) of the finished 3D vertical memory array 100 (e.g., even word lines 110(i) and odd word lines 110(i)).

Figure 4A:
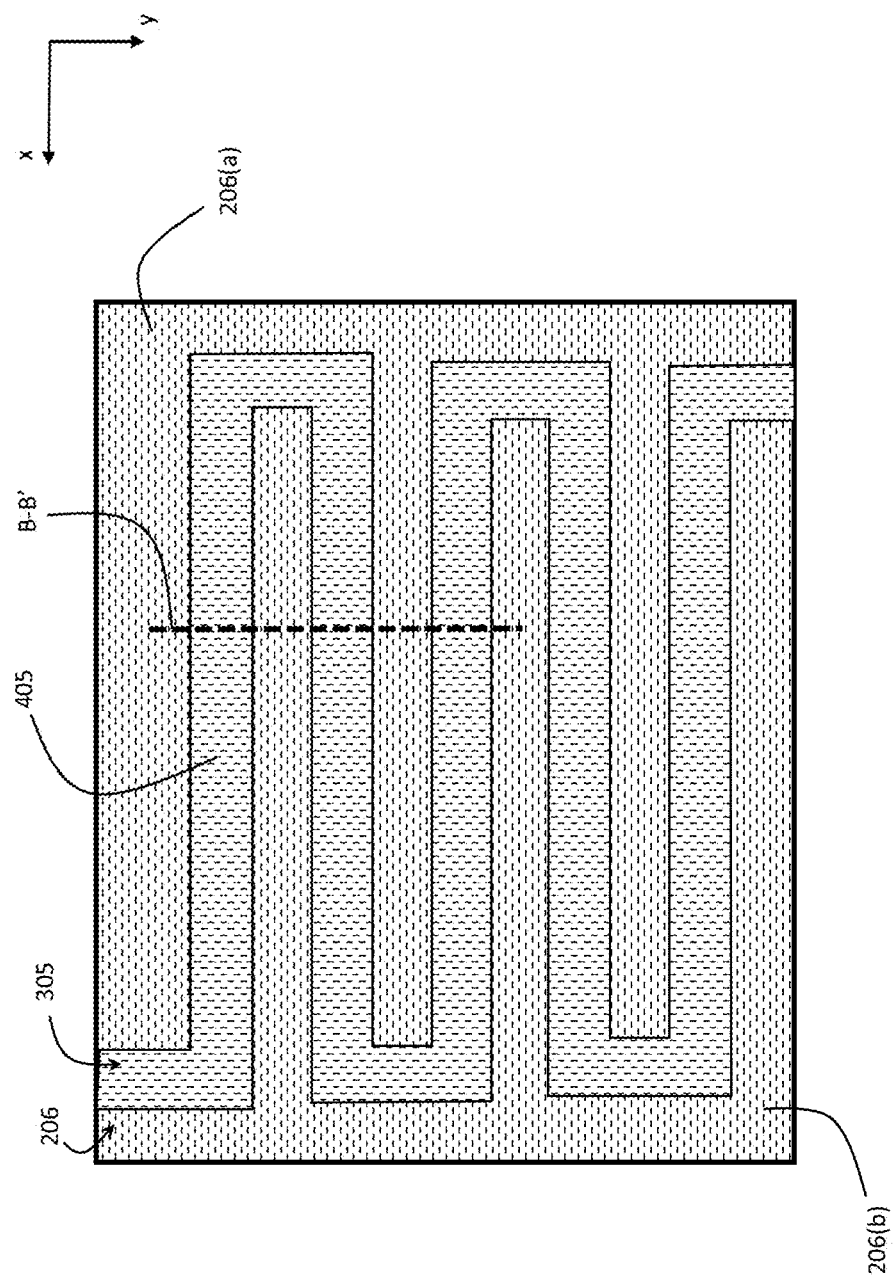
FIGS. 4A, 4B illustrate a third phase of a method for manufacturing a 3D vertical memory array corresponding to the 3D vertical memory array 100 of FIG. 1 in accordance with embodiments of the present disclosure.
Figure 4B:
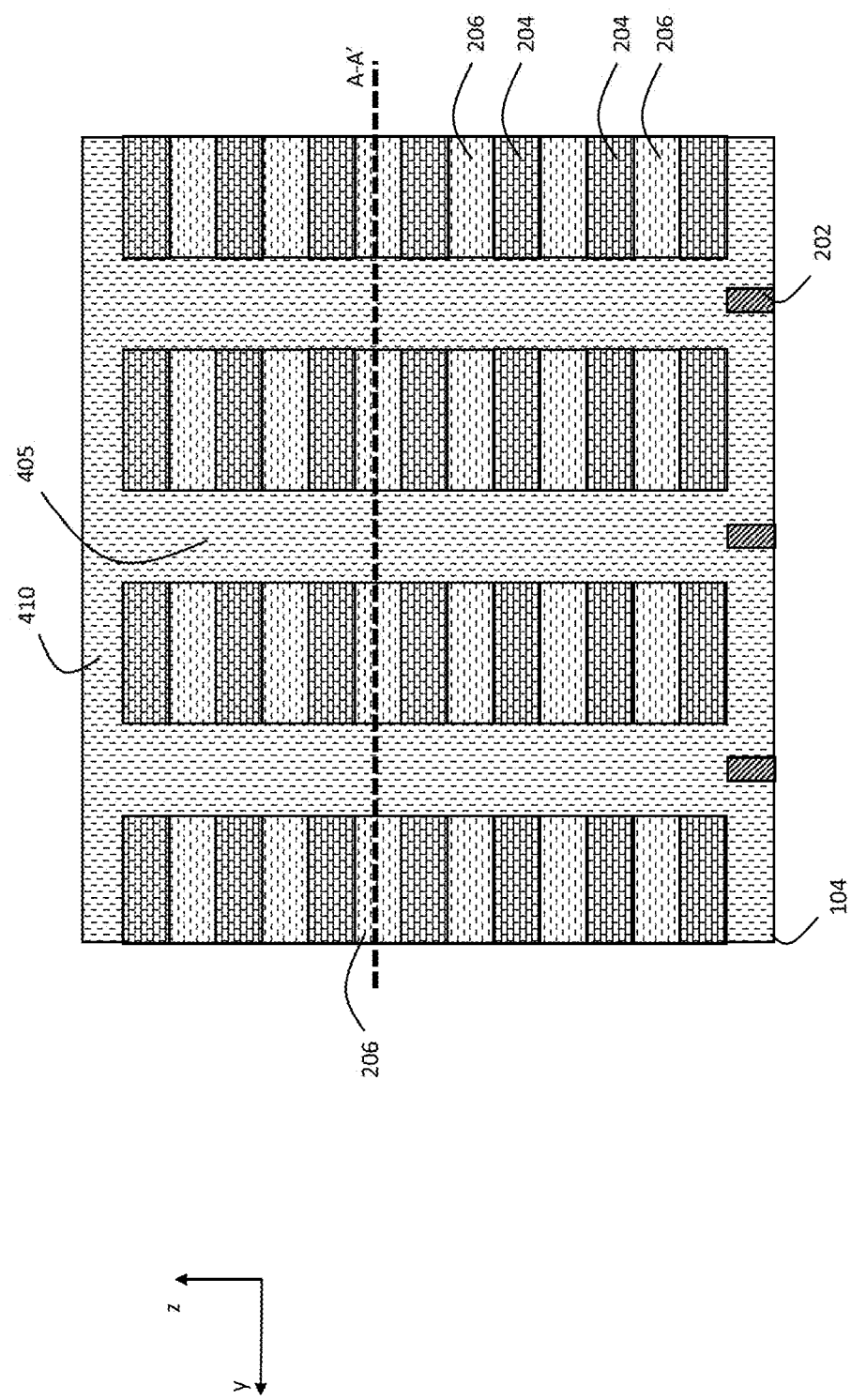

The next phase of the manufacturing method according to embodiments of the present disclosure is illustrated in FIGS. 4A and 4B, wherein FIG. 4A is a section view of an intermediate (i.e., partially manufactured) 3D vertical memory array taken from the section plane A-A' plane parallel to directions x and y and crossing a second dielectric material layer 206, and FIG. 4B is a section view of a portion of the same array taken from the section plane B-B' parallel to directions y and z and crossing three conductive contacts 202.

The phase of the method illustrated in FIGS. 4A and 4B comprises entirely filling (e.g., through a deposition process) the trench 305 with a dielectric material 405, such as the same dielectric material of the substrate 104, until reaching the top dielectric material layer 204 and forming a cap layer 410 covering said top dielectric material layer 204.

Figure 5A:
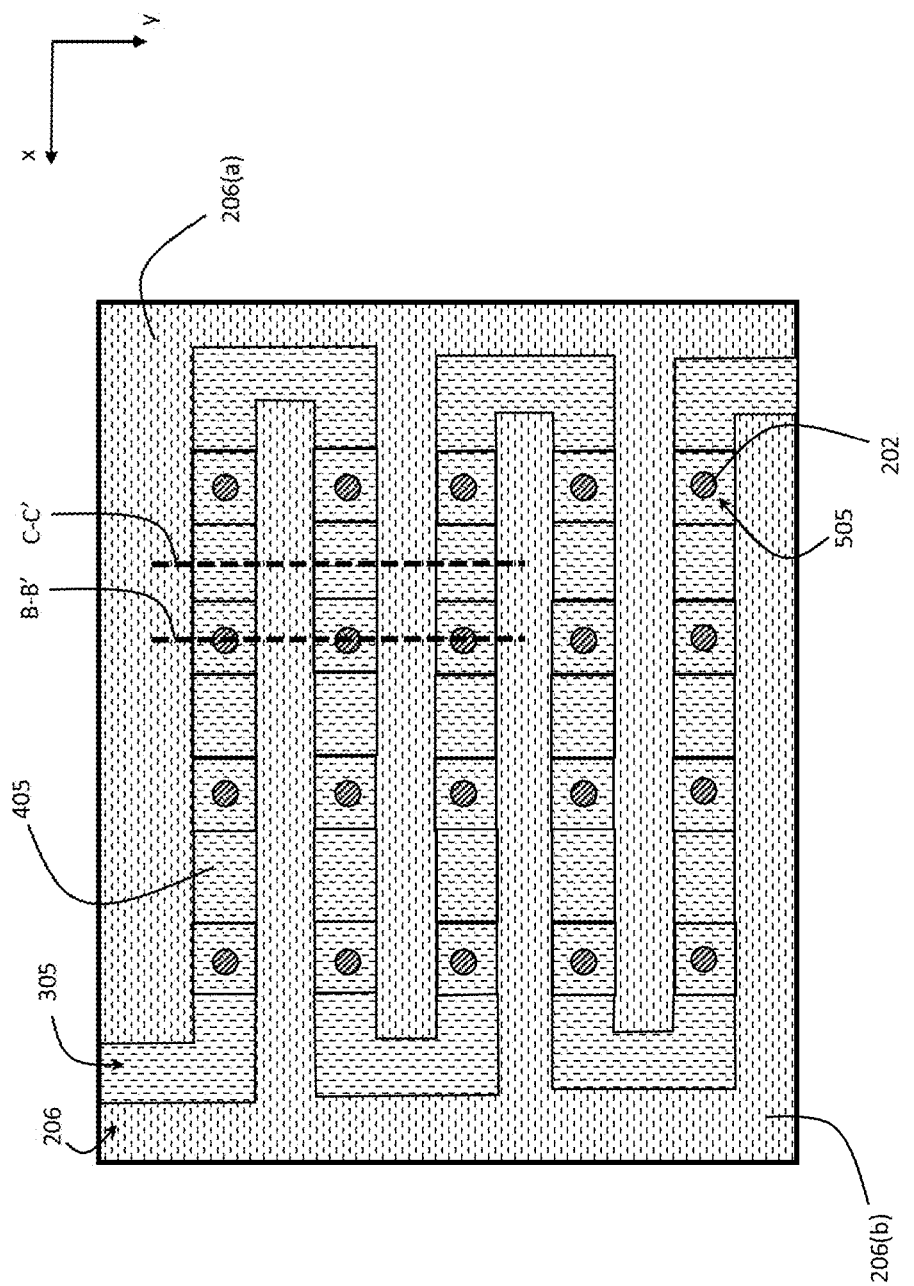
FIGS. 5A-5C illustrate a fourth phase of a method for manufacturing a 3D vertical memory array corresponding to the 3D vertical memory array 100 of FIG. 1 in accordance with embodiments of the present disclosure.
Figure 5B:
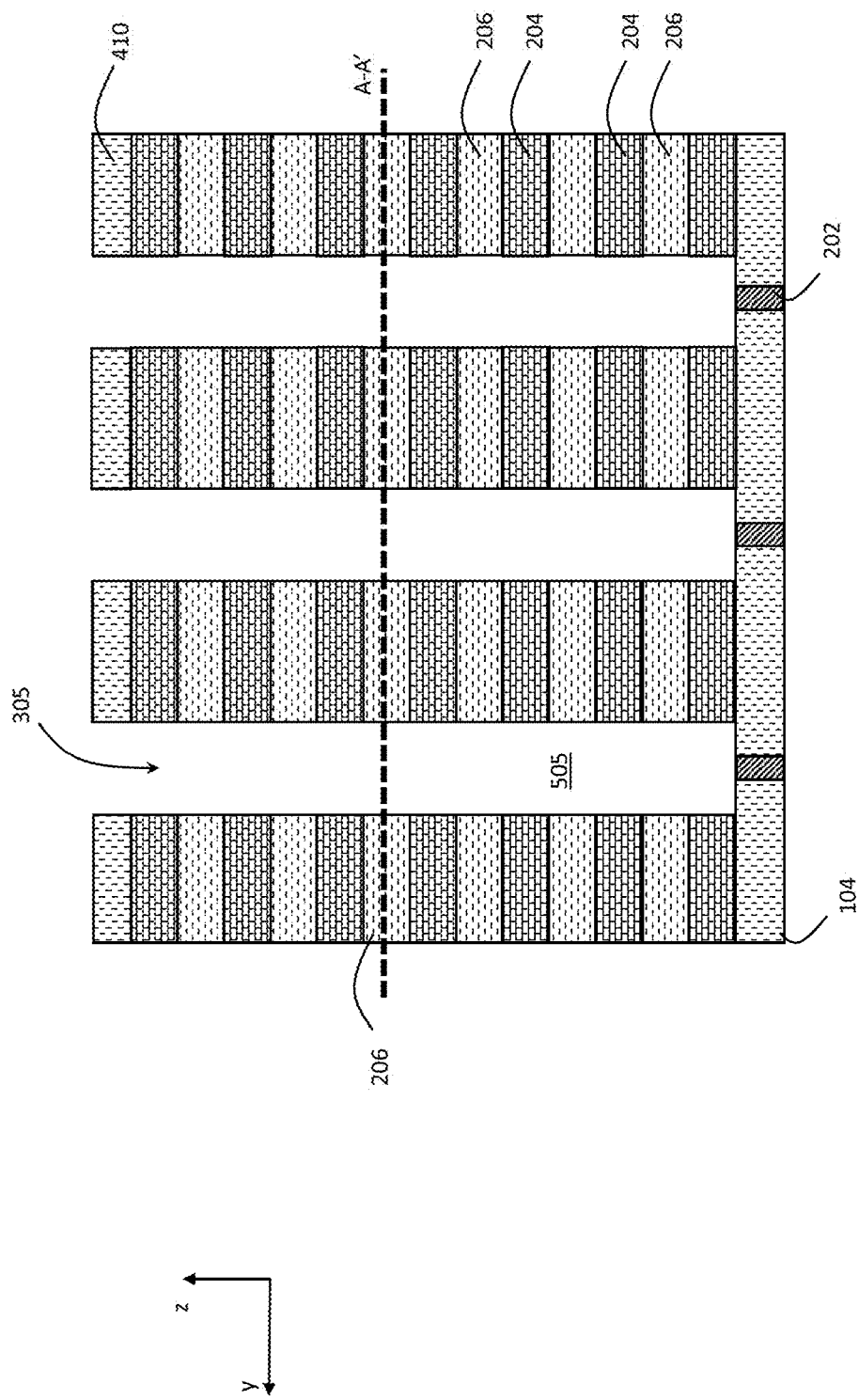
Figure 5C:
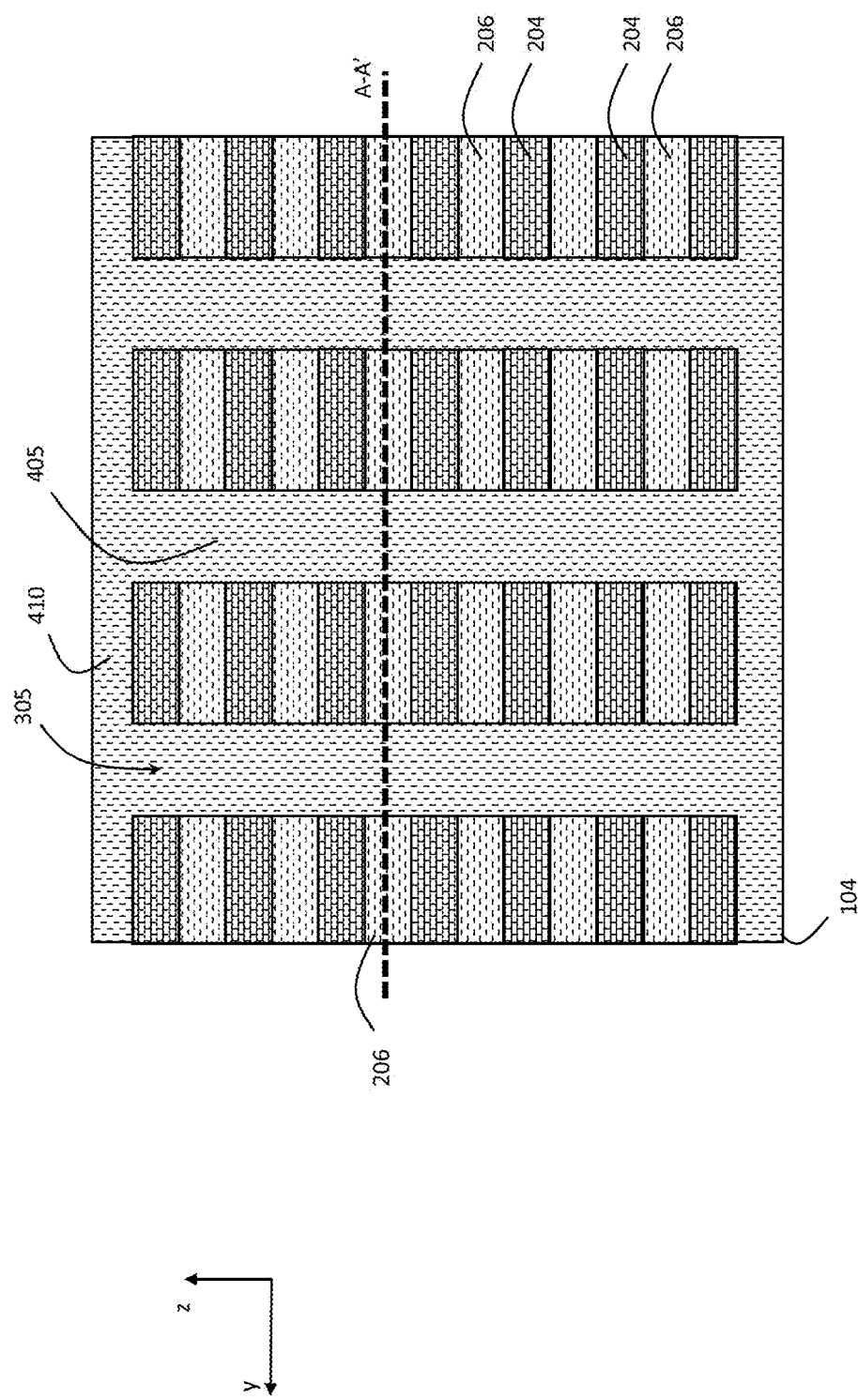

The next phase of the manufacturing method according to embodiments of the present disclosure is illustrated in FIGS. 5A, 5B and 5C wherein FIG. 5A is a section view of an intermediate (i.e., partially manufactured) 3D vertical memory array taken from the section plane A-A' plane, FIG. 5B is a section view of a portion of the same array taken from the section plane B-B', and FIG. 5C is a section view of a portion of the same array taken from a section plane C-C' parallel the section plane B-B' and displaced from the latter along direction x so as to be located between pairs of adjacent conductive contacts 202.

The phase of the method illustrated in FIGS. 5A-5C comprises forming for each conductive contact 202 a respective hole-like trench 505 that crosses—along direction z—the cap layer 410 and the dielectric material 405 inside the serpentine-like trench 305 until exposing the conductive contact 202. These hole-like trenches 505 will be used to define the conductive pillars forming the digit lines 115.

According to an embodiment of the present disclosure, the formation of the hole-like trenches 505 is carried out by means of a selective vertical etching operation directed to etch (portions of) the dielectric material 405 inside the serpentine-like trench and the cap layer 410 only, without attacking the dielectric materials forming the first and second dielectric material layers 204, 206.

Figure 6A:
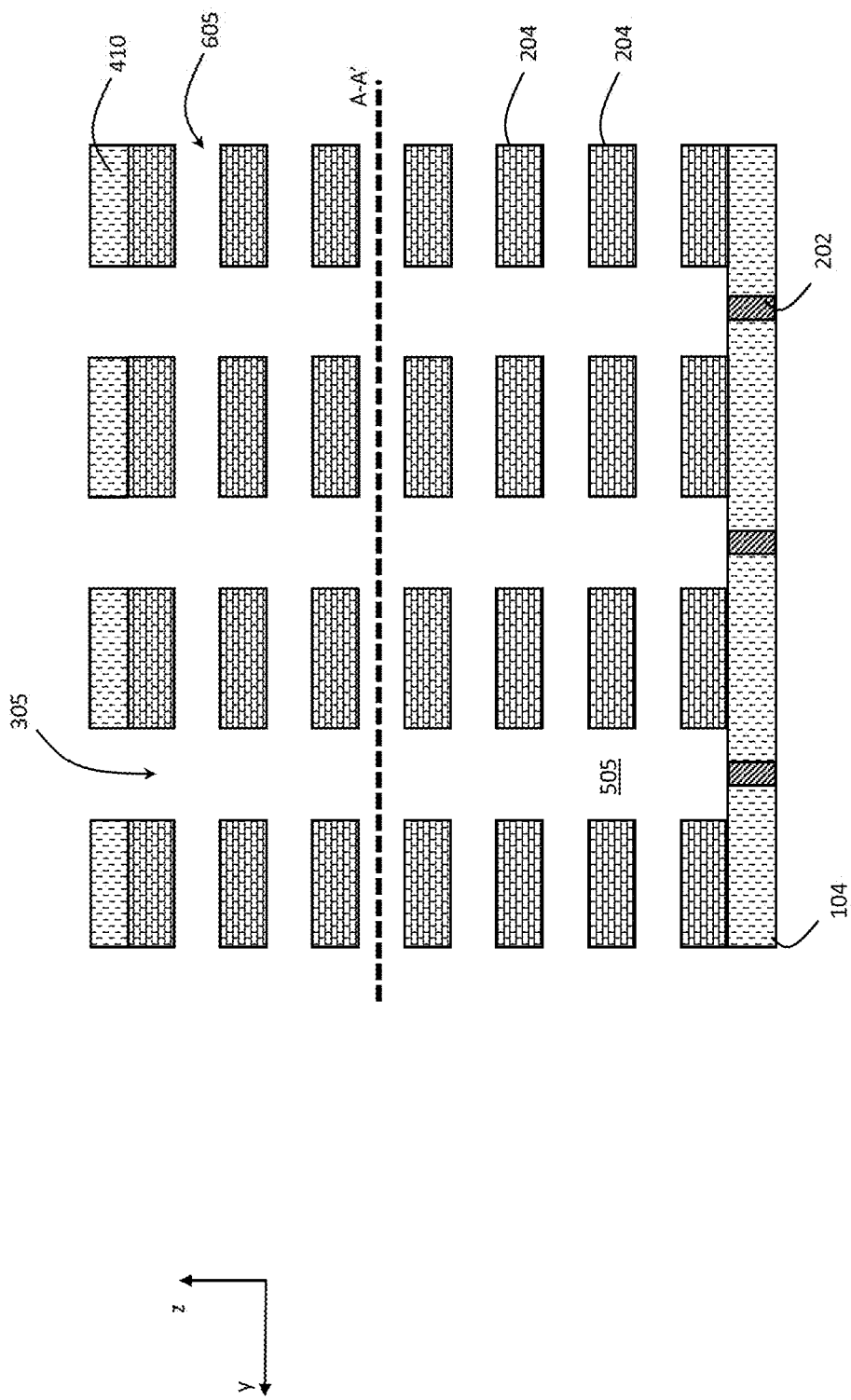
FIGS. 6A, 6B illustrate a fifth phase of a method for manufacturing a 3D vertical memory array corresponding to the 3D vertical memory array 100 of FIG. 1 in accordance with embodiments of the present disclosure.
Figure 6B:
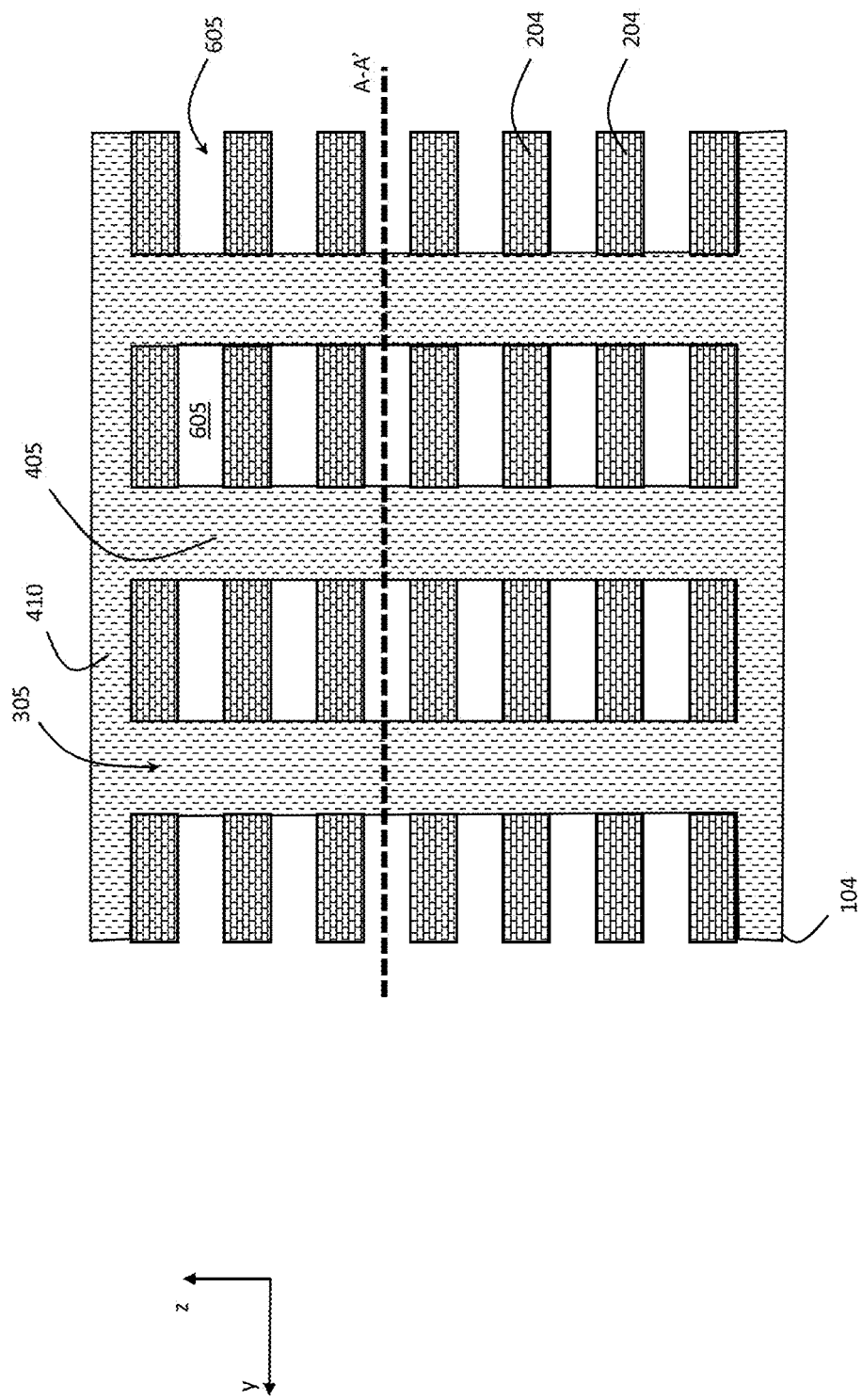

The next phase of the manufacturing method according to embodiments of the present disclosure is illustrated in FIGS. 6A and 6B, wherein FIG. 6A is a section view of a portion of an intermediate (i.e., partially manufactured) 3D vertical memory array taken from the section plane B-B' and FIG. 6B is a section view of a portion of the same array taken from the section plane C-C'.

The phase of the method illustrated in FIGS. 6A and 6B provides for exploiting the previously generated hole-like trenches 505—which will be used later on for the generation of the conductive pillars corresponding to the digit lines 115—for providing access to all the stacked first and second dielectric material layers 204, 206 from a large number of different points across the array.

According to an embodiment of the present disclosure, the hole-like trenches 505 are exploited for removing the dielectric material of the second dielectric material layers 206.

According to an embodiment of the present disclosure, an isotropic etching operation is performed for selectively removing the dielectric material of the second dielectric material layers 206. According to an embodiment of the present disclosure, an etching agent is provided through the hole-like trenches 505, configured to selectively remove the dielectric material of the second dielectric material layers 206 (e.g., silicon nitride), without attacking the dielectric material of the first dielectric material layers 204. Since the hole-like trenches 505 are distributed across the 3D array structure in a high number and with a high density—such as for example every 60 nm—the etching agent can easily reach all (i.e., at any depth along direction z) the second dielectric material layers 206 and propagate along directions x and y between adjacent first dielectric material layers 204 while the second dielectric material layers 206 are being etched and removed. In this way, according to this embodiment of the disclosure, the second dielectric material layers 206 can be efficiently removed.

The resulting layered arrangement, in which empty cavities 605 are formed between adjacent first dielectric material layers 204, is mechanically supported by the dielectric material structure comprising the dielectric material 405 of the serpentine-like trench 305, the cap layer 410, and the substrate 104.

Figure 7A:
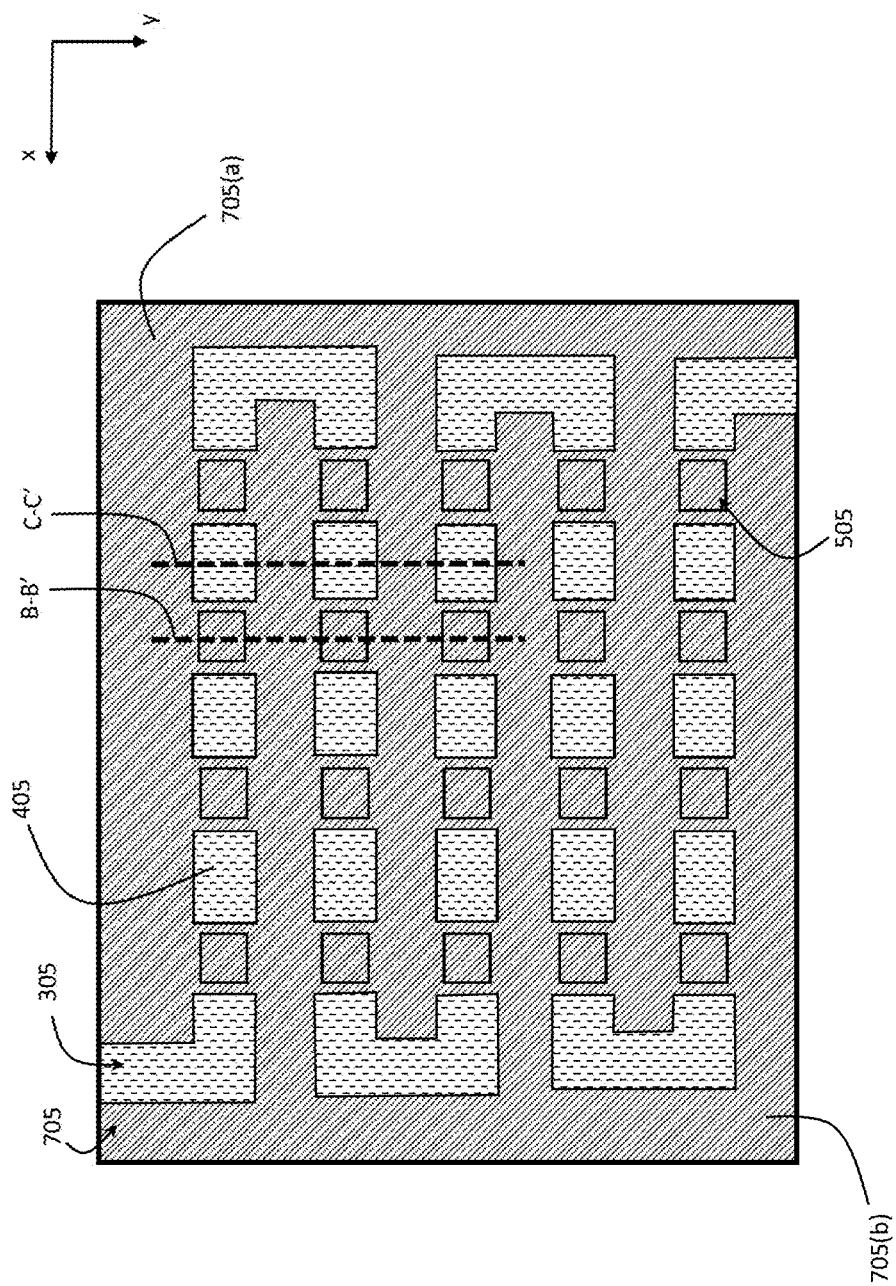
FIGS. 7A-7C illustrate a sixth phase of a method for manufacturing a 3D vertical memory array corresponding to the 3D vertical memory array 100 of FIG. 1 in accordance with embodiments of the present disclosure.
Figure 7B:
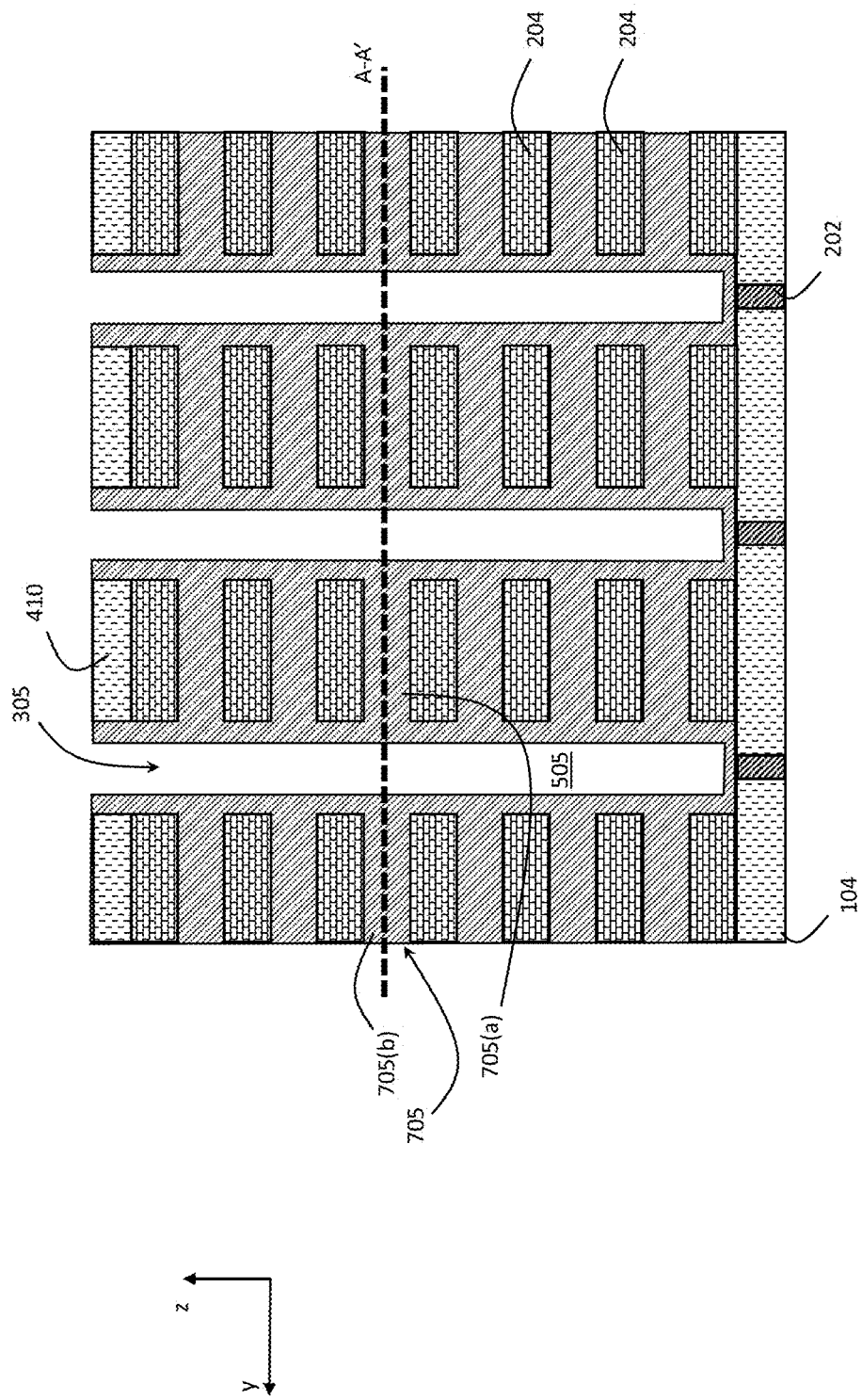
Figure 7C:
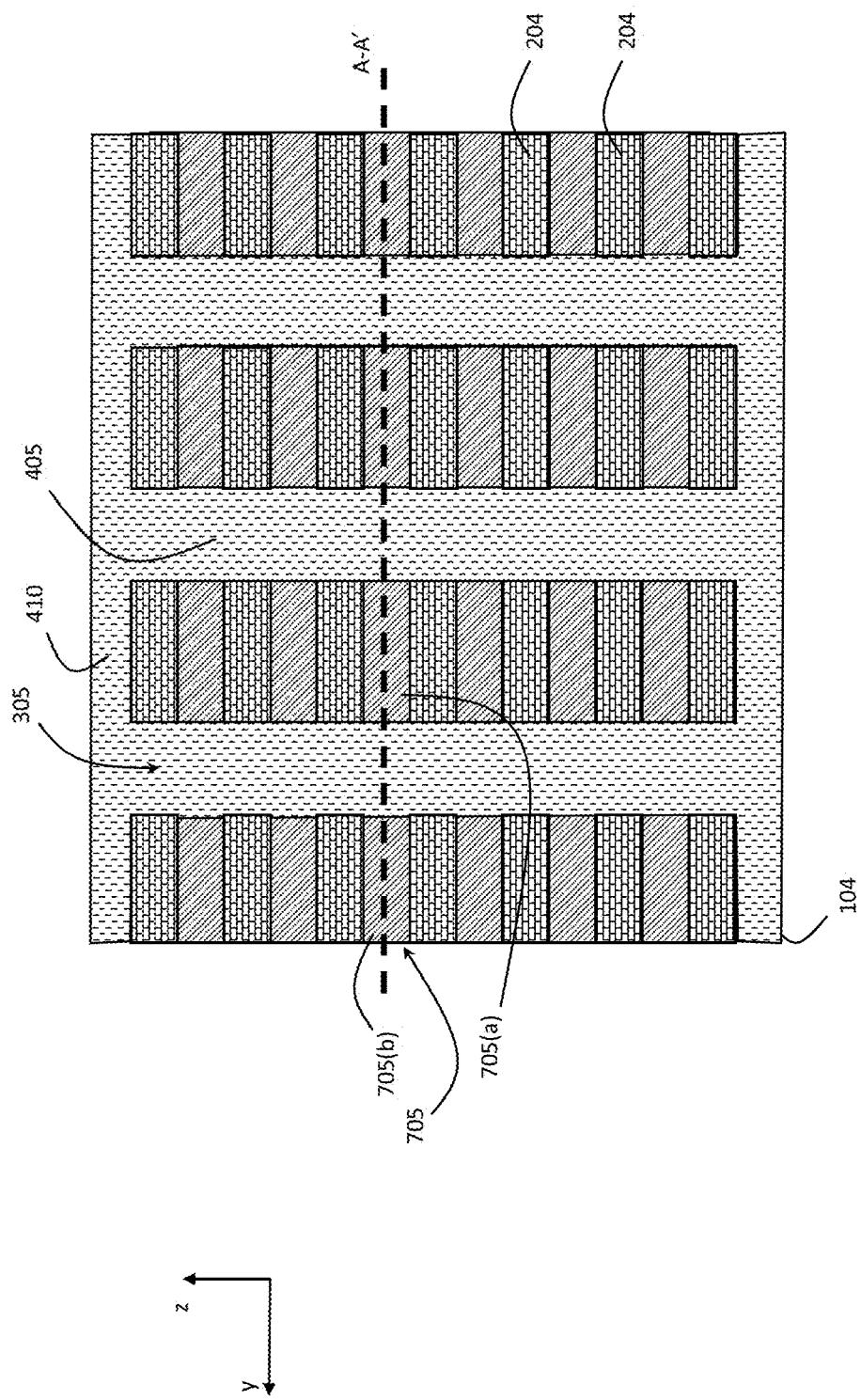

The next phase of the manufacturing method according to embodiments of the present disclosure is illustrated in FIGS. 7A, 7B and 7C wherein FIG. 7A is a section view of an intermediate (i.e., partially manufactured) 3D vertical memory array taken from the section plane A-A' plane, FIG. 7B is a section view of a portion of the same array taken from the section plane B-B', and FIG. 7C is a section view of a portion of the same array taken from the section plane C-C'.

The phase of the method illustrated in FIGS. 7A, 7B and 7C provides for exploiting again the hole-like trenches 505, this time for accessing the cavities 605 and filling it (e.g., by means of a deposition process) with a conductive material, such as tungsten or molybdenum, in order to form corresponding conductive material layers 705 between the first dielectric material layers 204. During this phase, also the bottom of each hole like trench 505, as well as the side thereof will be covered by conductive material. The conductive material layers 705 will be used for the formation of the word lines 110($i$) associated to the decks 105($i$) of the finished 3D vertical memory array 100.

Again, since the hole-like trenches 505 are distributed across the 3D array structure in a high number and with a high density, the conductive material can easily reach all (i.e., at any depth along direction z) the cavities 605 and propagate along directions x and y. In this way, according to this embodiment of the disclosure, the cavities 605 can be effectively filled and the conductive material layers 705 are generated in a very efficient way.

Because of the dielectric material 405 of the serpentine-like trench 305, each conductive material layer 705 is bifurcated into a first conductive material portion 705($a$) and a second conductive material portion 705($b$). According to an embodiment of the present disclosure, the (separate) portions 705($a$) and 705($b$) of each conductive material layer 705 will form interleaved word lines 110($i$) associated to the corresponding deck 105($i$) of the finished 3D vertical memory array 100 (e.g., the portions 705($a$) for odd word lines 110($i$) and the portions 705($b$) for even word lines 110($i$)).

Figure 8A:
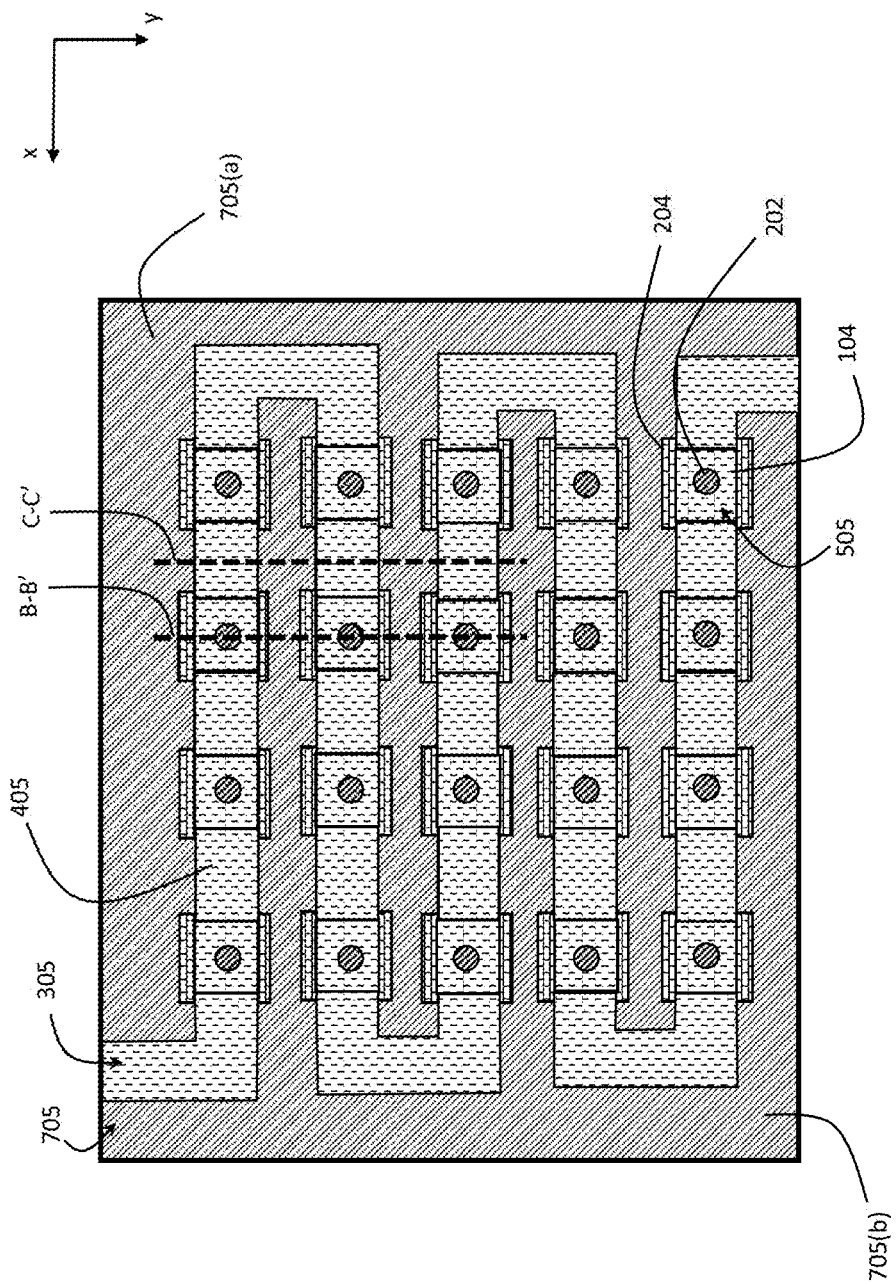
FIGS. 8A-8C illustrate a seventh phase of a method for manufacturing a 3D vertical memory array corresponding to the 3D vertical memory array 100 of FIG. 1 in accordance with embodiments of the present disclosure.
Figure 8B:
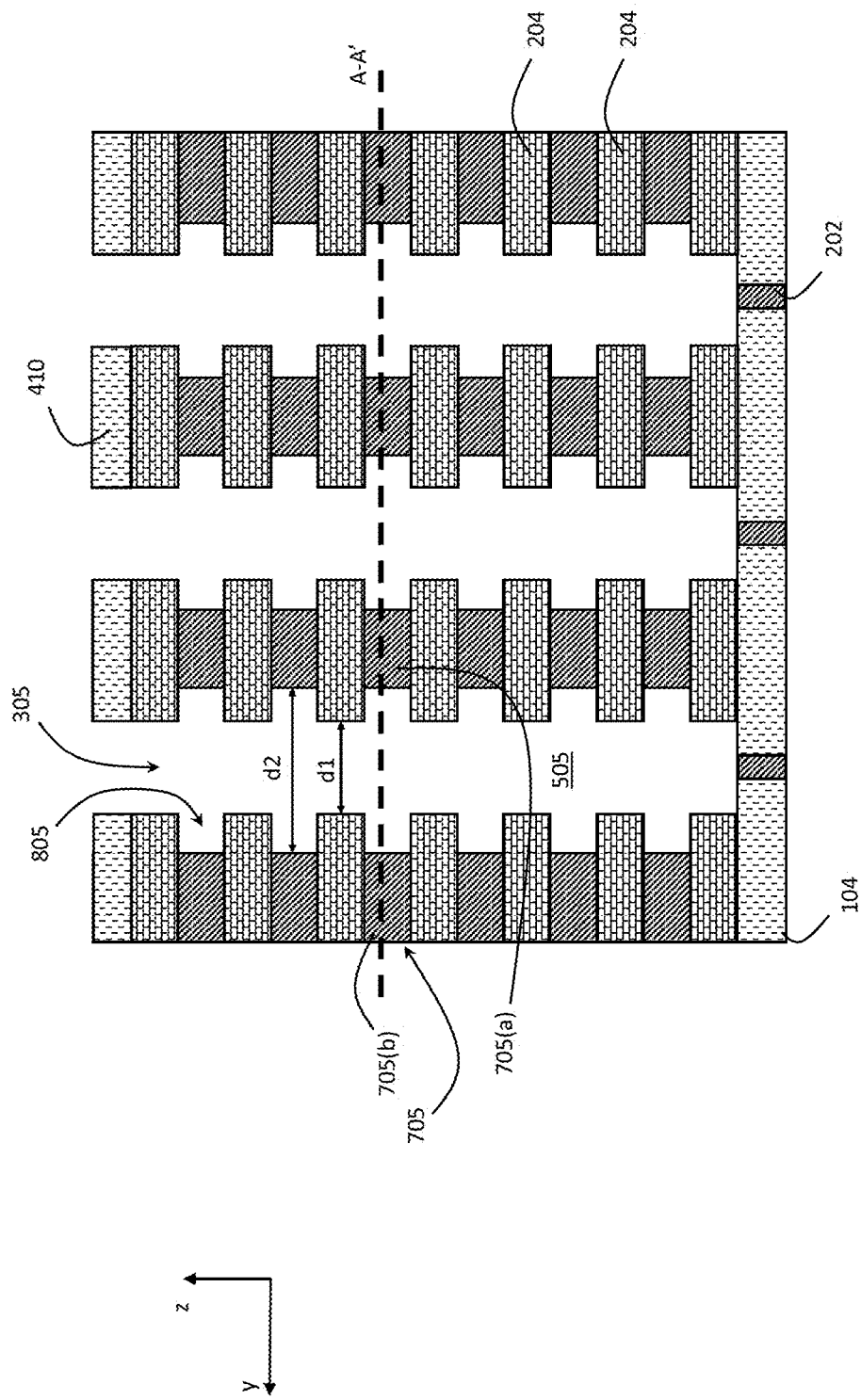
Figure 8C:
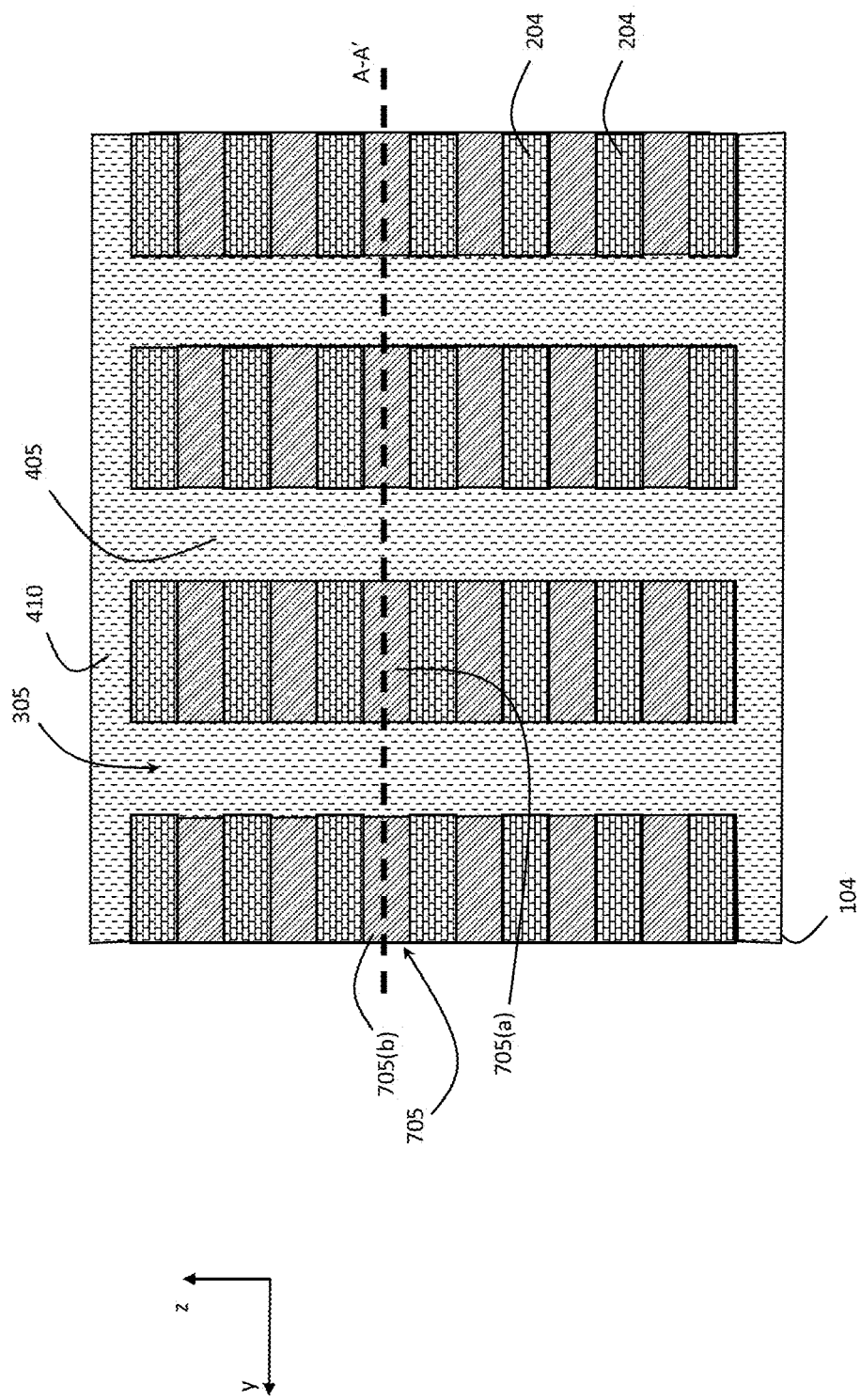

The next phase of the manufacturing method according to embodiments of the present disclosure is illustrated in FIGS. 8A, 8B and 8C wherein FIG. 8A is a section view of an intermediate (i.e., partially manufactured) 3D vertical memory array taken from the section plane A-A' plane, FIG. 8B is a section view of a portion of the same array taken from the section plane B-B', and FIG. 8C is a section view of a portion of the same array taken from the section plane C-C'.

The phase of the manufacturing method illustrated in FIGS. 8A, 8B, 8C, provides for forming a plurality of recesses 805 in each conductive material layer 705 at the hole-like trenches 505. For example, each recess 805 is formed in such a way to face toward a respective hole-like trench 505.

According to an embodiment of the present disclosure, the recesses 805 are formed by means of an etching operation in sidewalls of the hole-like trenches 505 in an isotropic way.

The recesses 805 are formed in such a way that the sidewalls of a generic hole-like trench 505 are spaced apart to each other along direction x from a first distance d1 (between portions of the first dielectric material layers 204 facing to each other in said hole-like trench 505), while pairs of recesses 805 facing to each other at said hole-like trench 505 comprises side walls spaced apart to each other along direction x from a second distance d2 higher than the first distance d1 (see FIG. 8B).

As will be described in the following, the recesses 805 will be used for the formation of the data storage elements 125(i) of the memory cells of the finished 3D vertical memory array 100.

Figure 9A:
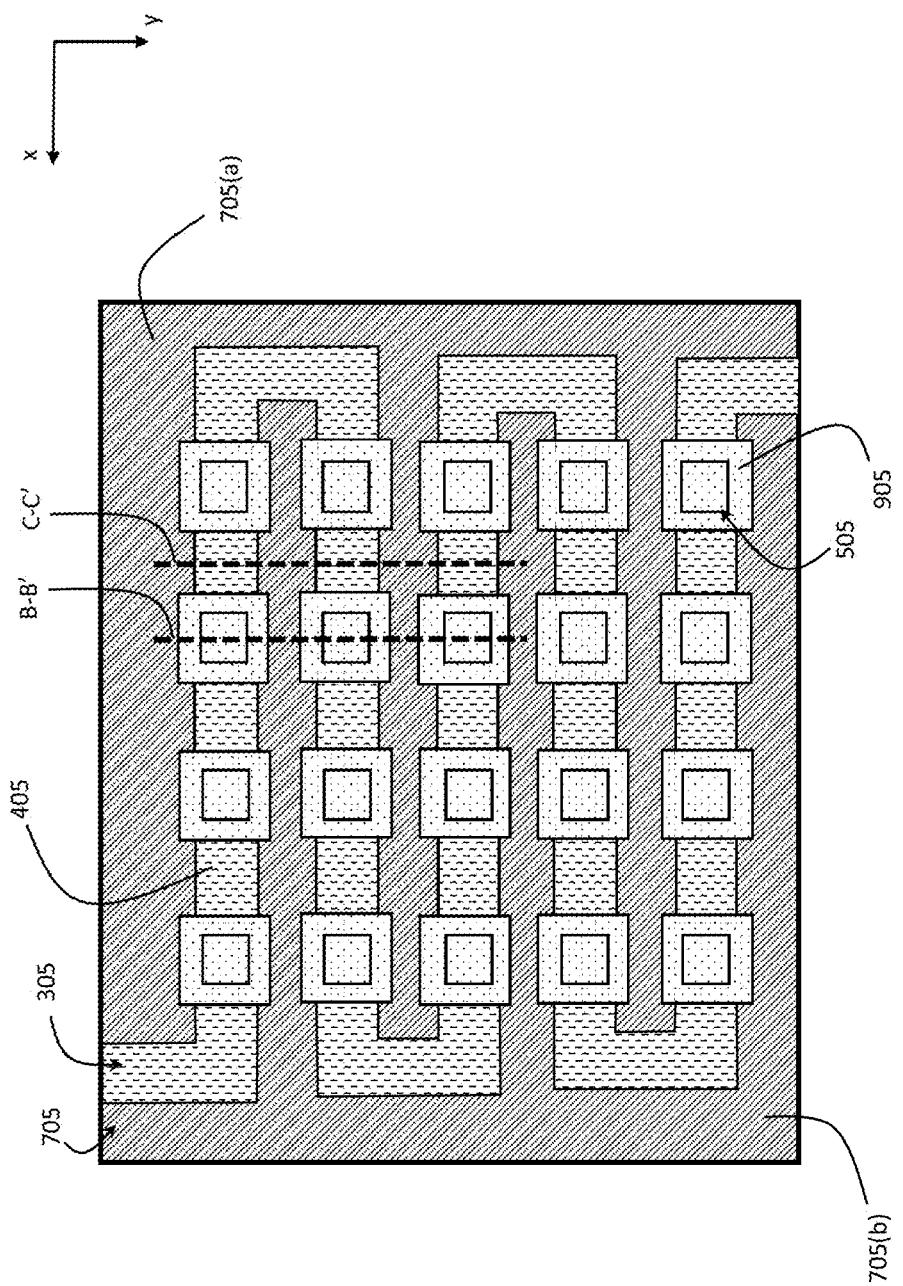
FIGS. 9A, 9B illustrate a eighth phase of a method for manufacturing a 3D vertical memory array corresponding to the 3D vertical memory array 100 of FIG. 1 in accordance with embodiments of the present disclosure.
Figure 9B:
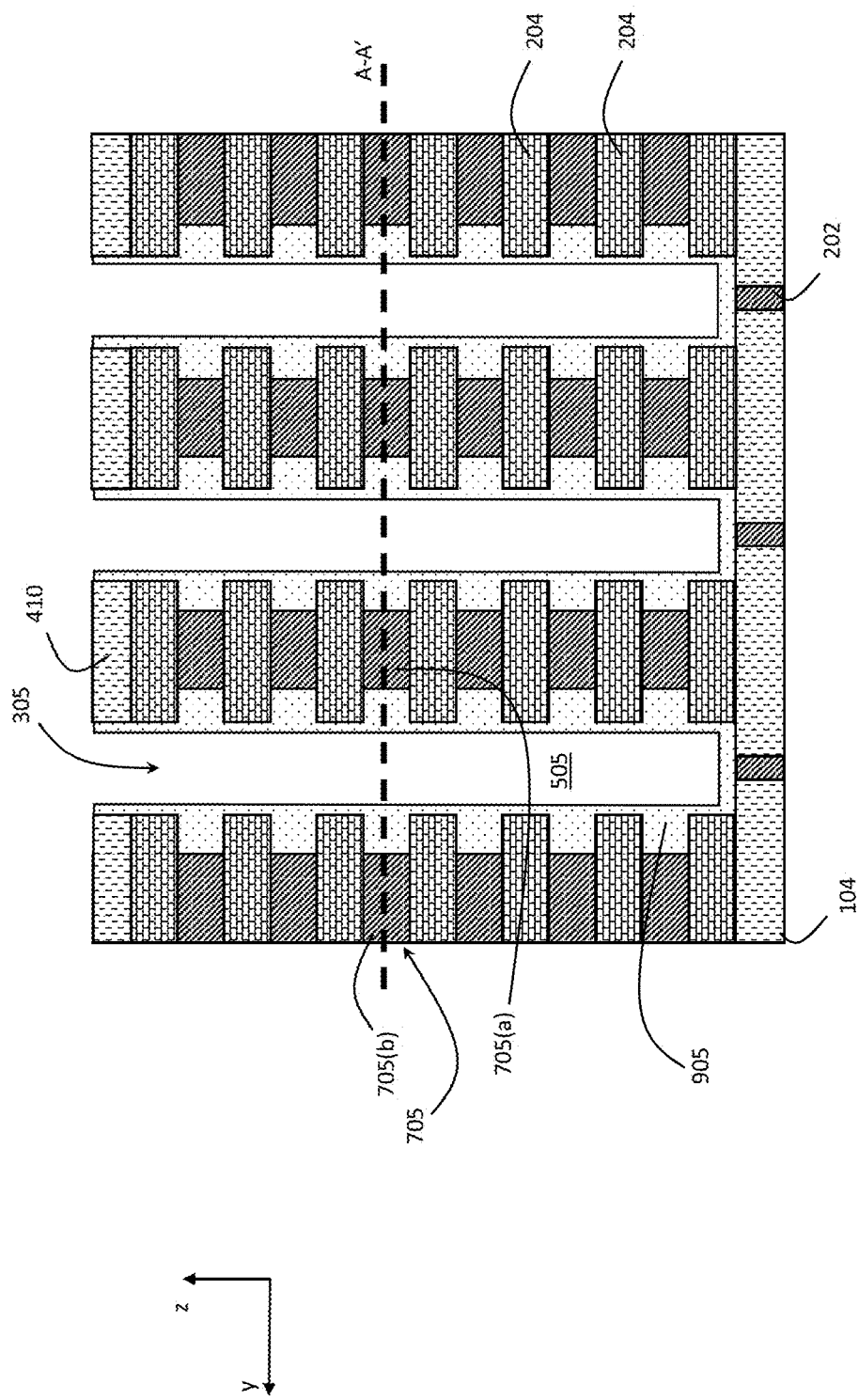

The next phase of the manufacturing method according to embodiments of the present disclosure is illustrated in FIGS. 9A and 9B wherein FIG. 9A is a section view of an intermediate (i.e., partially manufactured) 3D vertical memory array taken from the section plane A-A' plane, and FIG. 9B is a section view of a portion of the same array taken from the section plane B-B'.

The phase of the manufacturing method illustrated in FIGS. 9A and 9B provides for the conformal deposition of a chalcogenide material 905, for example a chalcogenide alloy and/or glass, into the hole-like trenches 505 (for example, a sidewall direction conformal deposition). The chalcogenide material 905 is deposited in such a way to cover the bottom and side walls of the hole-like trenches 505, filling the recesses 805 formed in the conductive material layers 705. In this way, the chalcogenide material 905 contacts the conductive material layers 705 (the portions 705(a) and 705(b) thereof).

Figure 10A:
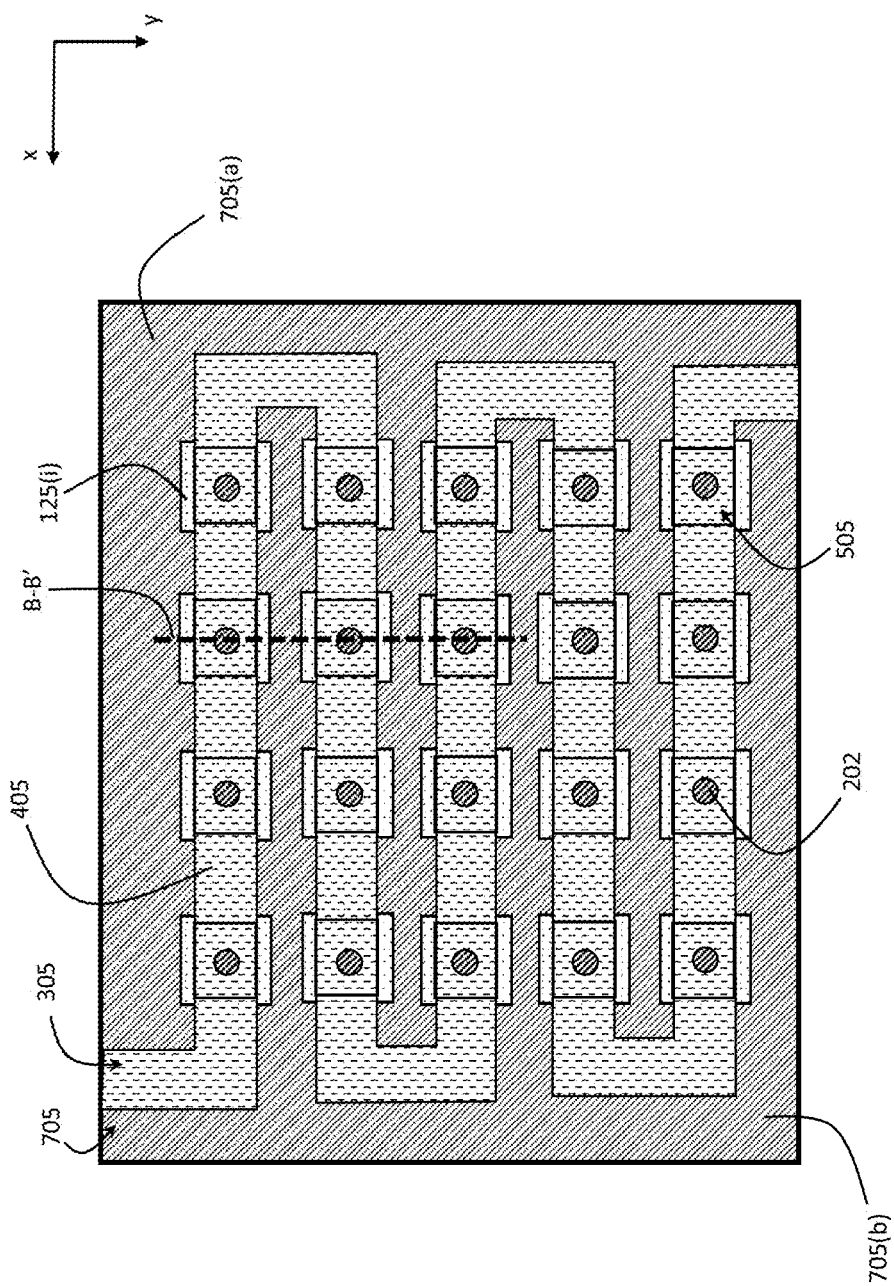
FIGS. 10A, 10B illustrate a ninth phase of a method for manufacturing a 3D vertical memory array corresponding to the 3D vertical memory array 100 of FIG. 1 in accordance with embodiments of the present disclosure.
Figure 10B:
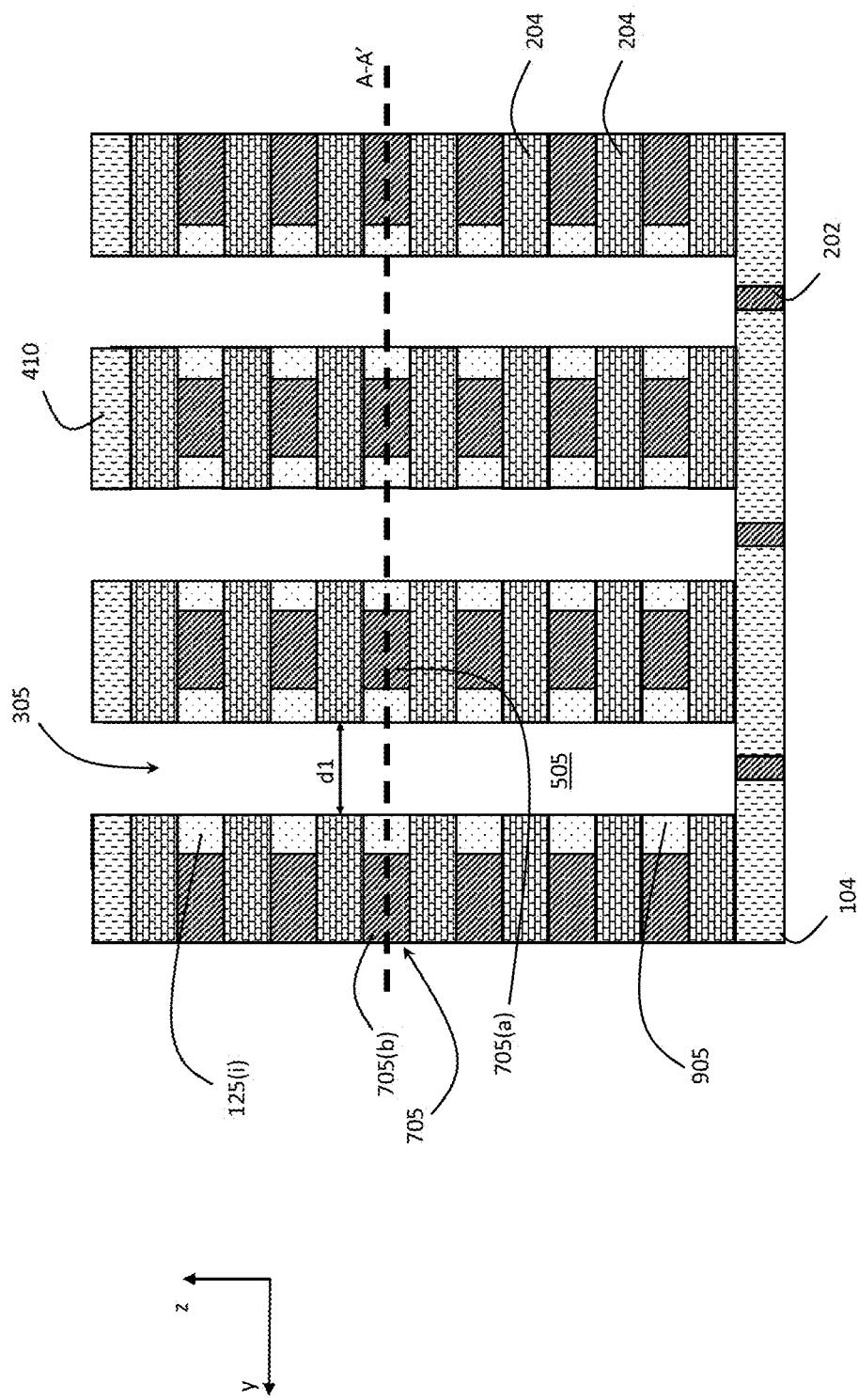

The next phase of the manufacturing method according to embodiments of the present disclosure is illustrated in FIGS. 10A and 10B wherein FIG. 10A is a section view of an intermediate (i.e., partially manufactured) 3D vertical memory array taken from the section plane A-A' plane, and FIG. 10B is a section view of a portion of the same array taken from the section plane B-B'.

The phase of the manufacturing method illustrated in FIGS. 10A and 10B provides for carrying out a selective etching operation directed to remove excess portions of the chalcogenide material 905 deposed in the hole-like trenches 505 in such a way that the remaining portions of the chalcogenide material 905 form the data storage elements 125(i) of the memory cells of the finished 3D vertical memory array 100.

According to an embodiment of the present disclosure, said etching operation is carried out in such a way that side surfaces of the data storage elements 125(i) (i.e., the surfaces thereof facing toward the hole-like trenches 505) are substantially co-planar with surfaces of the portions of the first dielectric material layers 204 facing toward the hole-like trenches 505, and are spaced apart to each other along direction y by the same distance d1 (see FIG. 10B).

In each recess 805, a corresponding storage element 125(i) is thus formed, which contacts (see FIG. 10B):
along direction y, a corresponding portion 705(a) or 705(b) of a conductive material layer 705, and
along direction z, two corresponding portions of two first dielectric material layers 204.

Making reference to FIG. 10B together with FIG. 1 (the latter illustrating a portion of the finished 3D vertical memory array 100), the portion 705(a) or 705(b) of conductive material layer 705 contacting the generic storage element 125(i) of the deck 105(i) correspond to the corresponding world line 110(i) for accessing the storage element 125(i), while the two portions of two first dielectric material layers 204 contacting the generic storage element 125(i) correspond to the dielectric material portions 128(i) and 128(i+1) that allow electric insulation of the storage element 125(i) from the storage elements 125(i+1) and 125(i−1) belonging to the adjacent decks 105(i+1), 105(i−1).

The etching operation of this phase is also carried out in such a way to remove chalcogenide material 905 from the bottom of the hole-like trenches 505 to expose the conductive contacts 202.

Figure 11A:
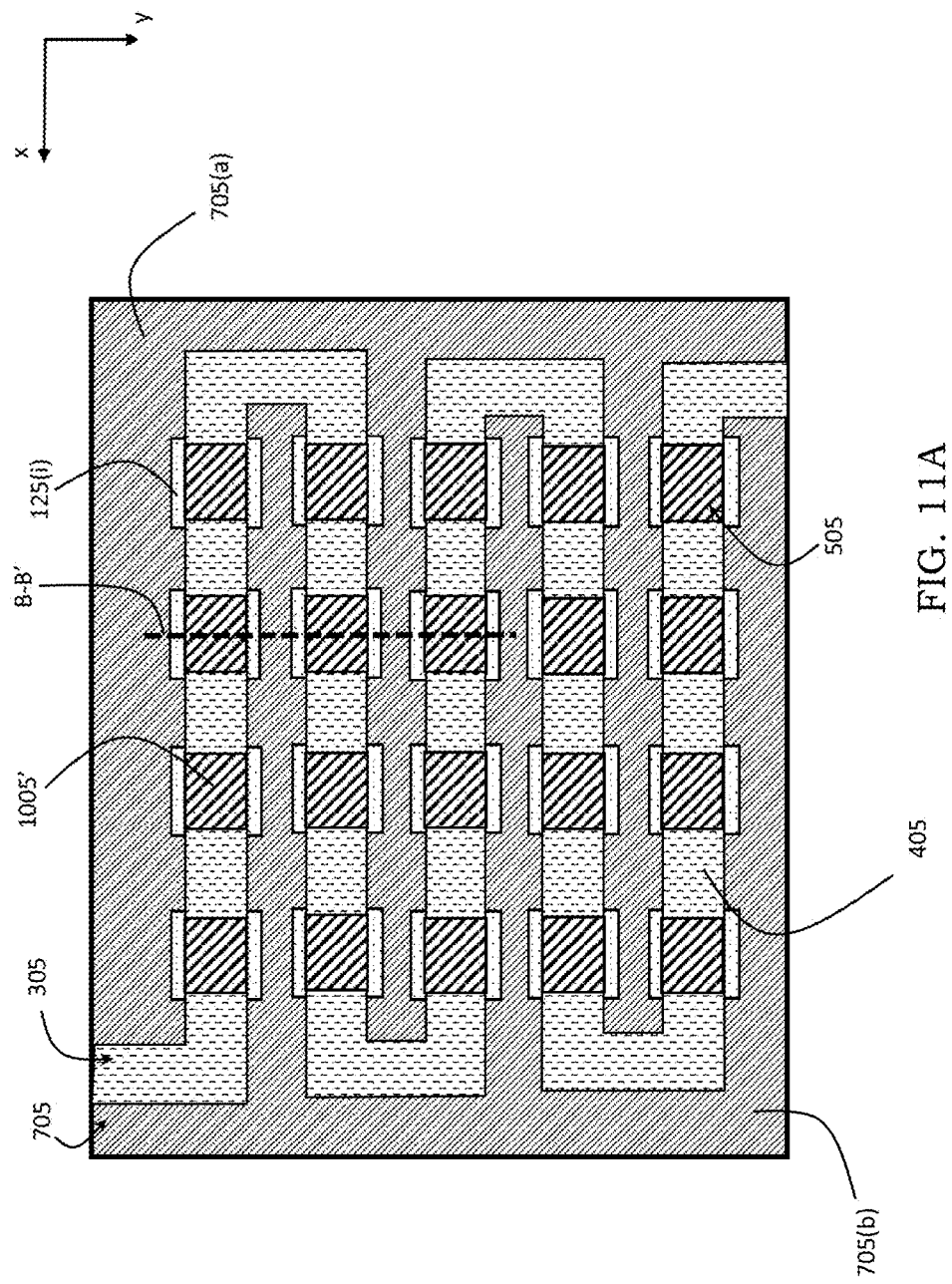
FIGS. 11A, 11B illustrate a tenth phase of a method for manufacturing a 3D vertical memory array corresponding to the 3D vertical memory array 100 of FIG. 1 in accordance with embodiments of the present disclosure.
Figure 11B:
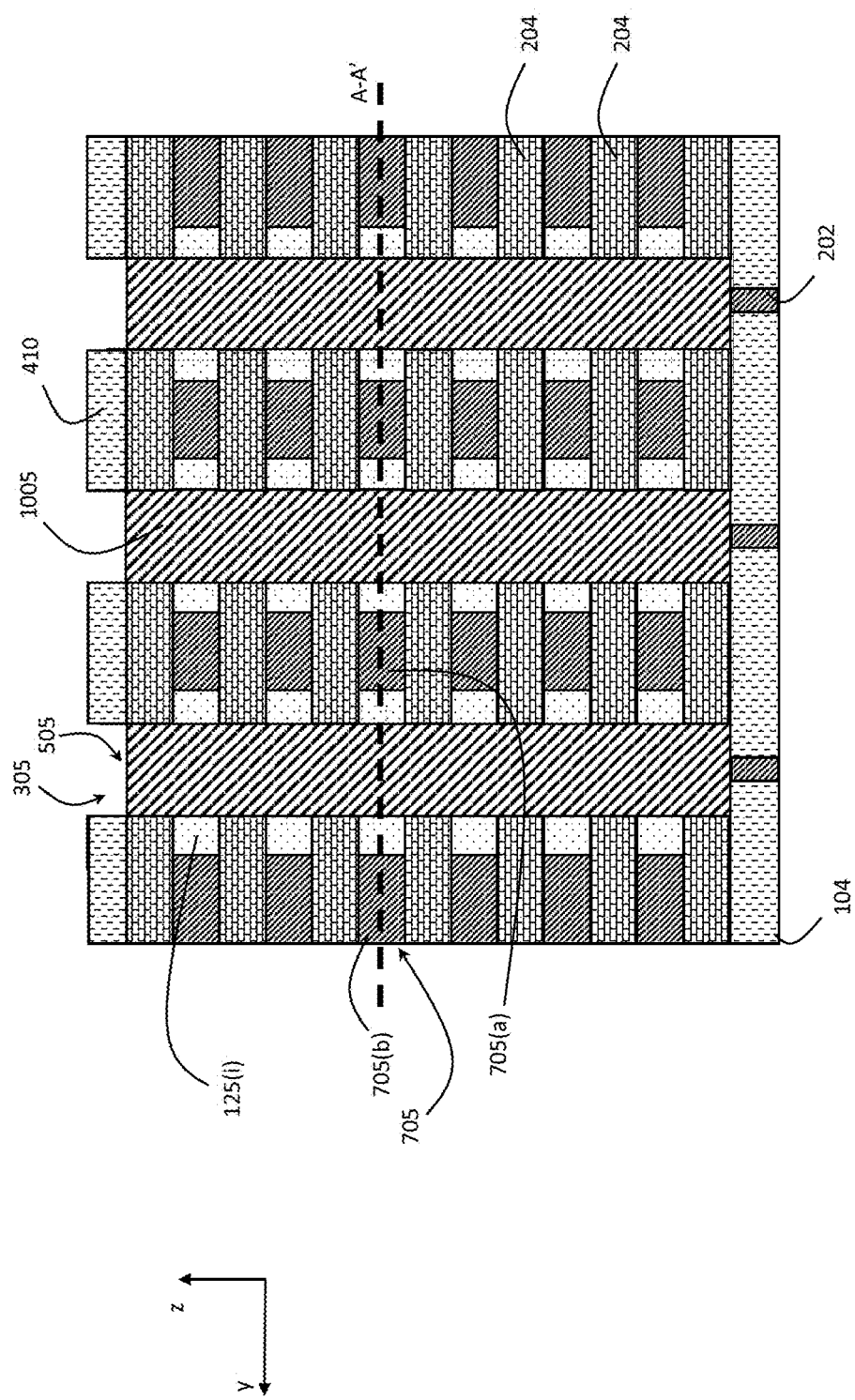

The next phase of the manufacturing method according to embodiments of the present disclosure is illustrated in FIGS. 11A and 11B wherein FIG. 11A is a section view of an intermediate (i.e., partially manufactured) 3D vertical memory array taken from the section plane A-A' plane, and FIG. 11B is a section view of a portion of the same array taken from the section plane B-B'.

The phase of the manufacturing method illustrated in FIGS. 11A and 11B provides for filling the hole-like trenches 505 with conductive material in order to form conductive pillars 1005 extending along direction z and contacting the storage elements 125(i).

According to an embodiment of the present disclosure, the conductive material of the conductive pillars 1005 is deposed according to a sidewall direction conformal deposition operation. In this specific case, the conductive material has to be compatible with a sidewall direction conformal deposition operation According to this embodiment, the conductive material of the conductive pillars 1005 may be the same used for the generation of the conductive material layers 705, provided that such conductive material is compatible with a sidewall direction conformal deposition operation.

Figure 12:
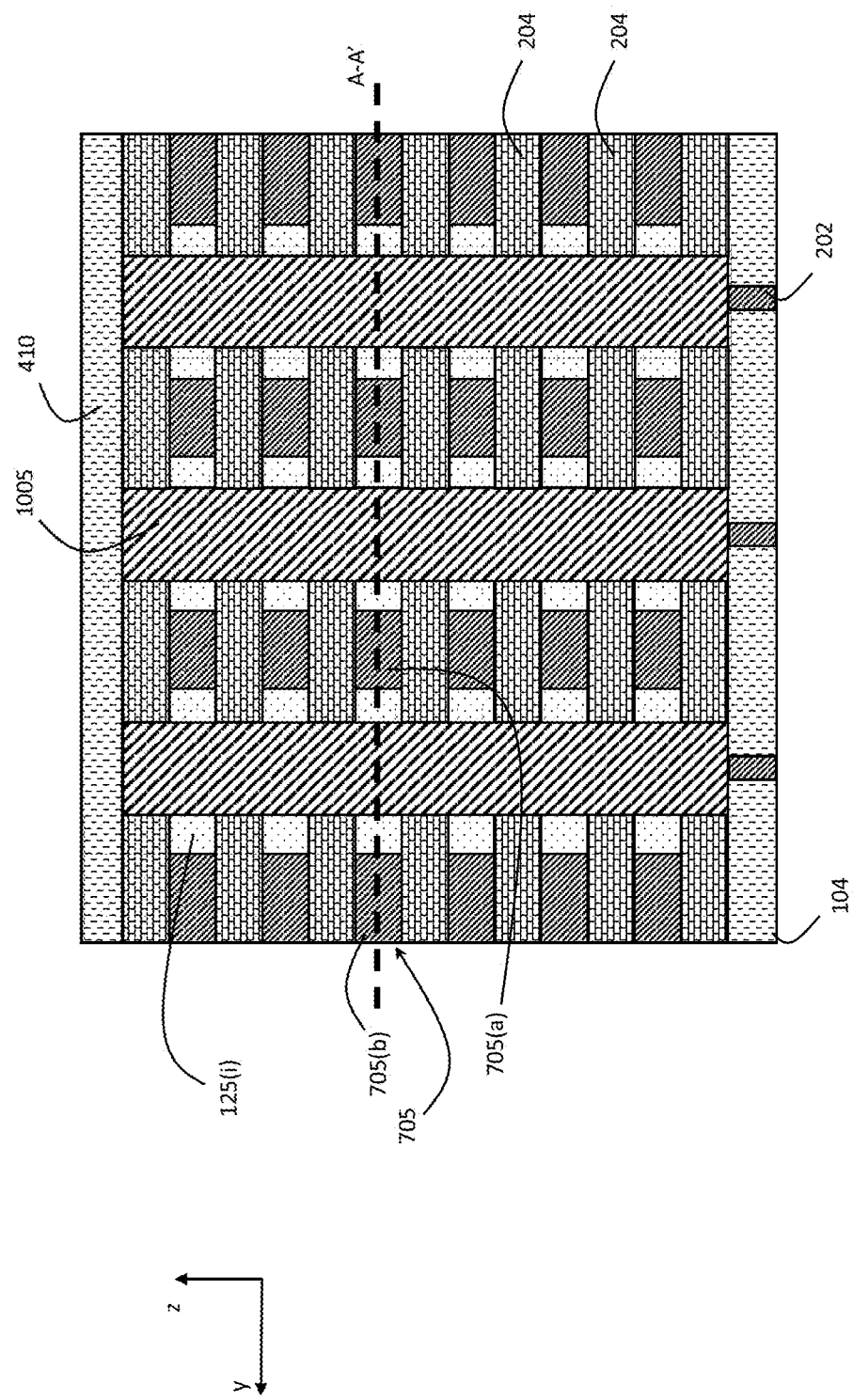
FIG. 12 illustrates an eleventh phase of a method for manufacturing a 3D vertical memory array corresponding to the 3D vertical memory array 100 of FIG. 1 in accordance with embodiments of the present disclosure.

The finished 3D vertical memory array 100 according to embodiments of the present disclosure is then obtained by covering the trench 305 opening in the cap layer 410 with the same dielectric material in order to cover also the conductive pillars 1005, as shown in the section view illustrated in FIG. 12 taken from the section plane B-B'.

Compared to the 3D vertical memory arrays obtained with known methods, the 3D vertical memory array that can be manufactured with the herein described manufacturing method according to embodiments of the present disclosure is more compact, requiring less area occupation. Compared in particular to the above mentioned known methods for manufacturing vertical 3D NAND memory devices based on the Replacement Gate architecture, a higher memory cell density is obtained. Indeed, while the known methods for manufacturing vertical 3D NAND memory devices based on the Replacement Gate architecture cause a waste of space because of the mandatory presence of a high number of dedicated slits (e.g., every four conductive pillars), for removing the sacrificial layers, the manufacturing method according to embodiments of the present disclosure advantageously exploit the hole-like trenches (used for the generation of the conductive pillars) also for the replacement of the sacrificial layers with the conductive layers corresponding to the word lines.

Moreover, the herein described manufacturing method according to embodiments of the present disclosure is particularly suited for manufacturing 3D vertical memory arrays of the cross-point type, since it provides for the replacement of the sacrificial layers with conductive material layers before the formations of the storage elements and of the conductive pillars.

Figure 13:
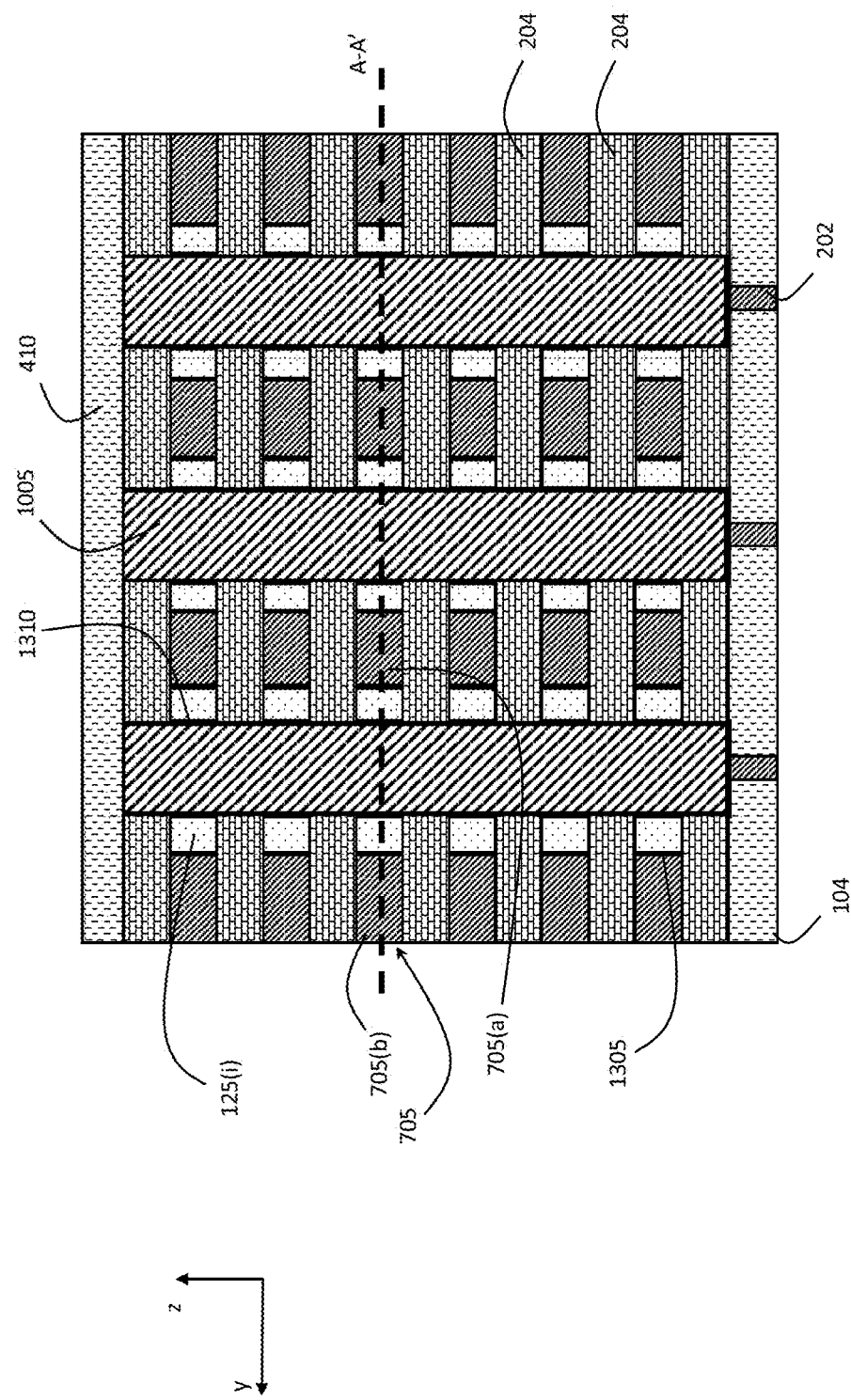
FIG. 13 illustrates a portion of a 3D vertical memory array corresponding to the 3D vertical memory array 100 of FIG. 1 in accordance with embodiments of the present disclosure.

According to an embodiment of the present disclosure illustrated in FIG. 13, in case of compatibility issues between the chalcogenide material of the storage elements 125(i) and the conductive material of the conductive material layers 705 and/or of the conductive pillars 1005, barriers (identified in FIG. 13 with reference 1305) could be interposed between the conductive material layers 705 and the storage elements 125(i), and/or barriers (identified in FIG.

13 with reference 1310) could be interposed between the conductive pillars 1005 and the storage elements 125(i) to avoid cross-contamination between the materials.

As already mentioned above, the herein described manufacturing method according to embodiments of the present disclosure is based on the replacement of sacrificial dielectric layers (the first dielectric material layers 204) with conductive material layers (the conductive material layer 705) exploiting the hole-like trenches 505, which are necessary for the formation of the conductive pillars 1005 corresponding to the digit lines 115 in the active portion of the memory array, i.e., the portion wherein the memory cells are located.

Figure 14:
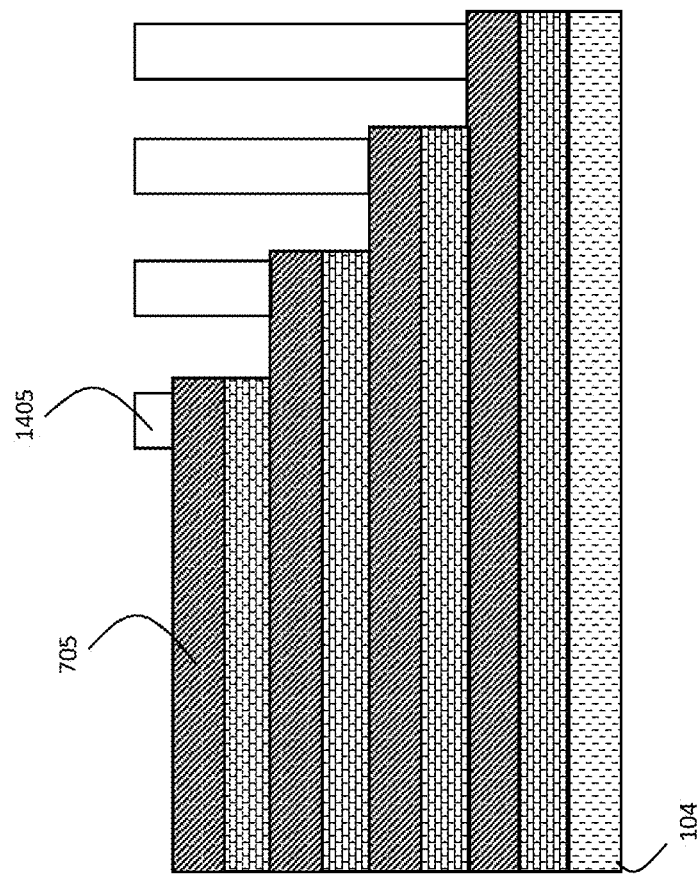
FIG. 14 illustrates an access portion of a 3D vertical memory array corresponding to the 3D vertical memory array 100 of FIG. 1 in accordance with embodiments of the present disclosure.

However, in order to access the (vertically stacked) word lines 110(i) of the 3D vertical memory array (e.g., for the providing program and/or read pulses), one or more access portions, for example located at one or more of the edges of the one or more active portions, in which the conductive material layers 705 have staggered lengths so as to form "steps" on one or more edges of the one or more active portions, as illustrated in the side view of FIG. 14.

Each respective "step" of the access portion corresponds to a respective layer of the 3D vertical memory array, and comprises a conductive access contact 1405 contacting a corresponding conductive material layer 705. In some embodiments, the staircase depicted in FIG. 14 may be formed according to a trim and etch technique.

Since the access portion does not comprise memory cells, the presence of hole-like trenches 505 for the formation of conductive pillars 1005 corresponding to digit lines 115 is not required. Moreover, the access portion has a non-negligible length (e.g., along direction x) in order to be sufficiently long to accommodate a large number of steps depending in turn on the number of stacked conductive material layers 705 (for example, 3-4 μm).

The absence of hole-like trenches 505 together with the non-negligible length of the access portion could make it not suitable to be directly manufactured with the previously described method (replacement of sacrificial dielectric layers with conductive material layers).

Indeed, in order to access the various layers of the access portion for removing the sacrificial dielectric layers therefrom, the closest hole-like trenches 505 through which etchant agent can be provided (i.e., in the active portion of the array) could be too far for allowing an efficient removal of the sacrificial dielectric layers. Similarly, the same closest hole-like trenches 505 through which conductive material can be provided for substituting the sacrificial dielectric layers could be too far for allowing an efficient formation of the conductive material layers.

Moreover, even if the sacrificial dielectric layers were actually removed from the access portion, the remaining dielectric material layers would collapse because of the too large size of the access portion.

Figure 15:
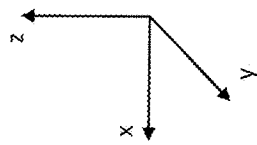
FIG. 15 illustrates a phase of a method for manufacturing the access portion of FIG. 14 in accordance with embodiments of the present disclosure.
Figure 15:
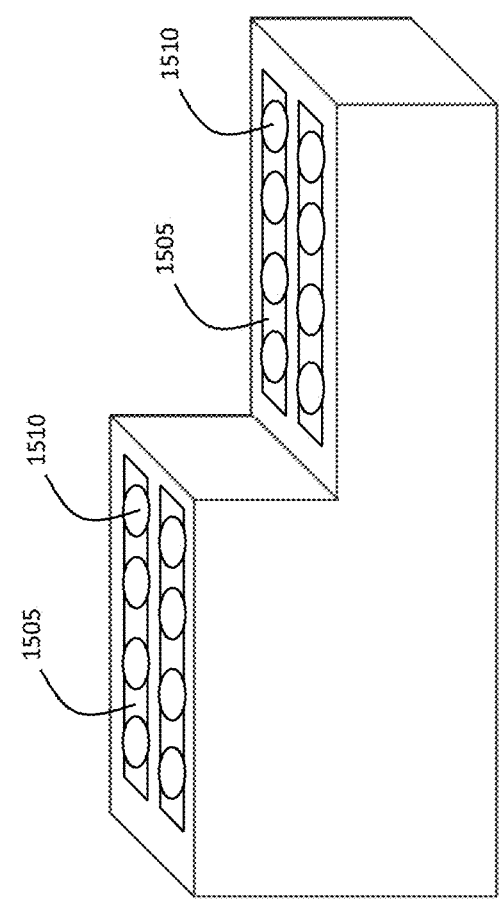

For this reason, according to an embodiment of the present disclosure illustrated in FIG. 15, dedicated (e.g., linear) trenches 1505 (functionally similar to the trench 305 described with reference to FIGS. 3A, 3B) are formed, and filled with dielectric material (like the filling of the trench 305 with dielectric material 405 described with reference to FIGS. 4A, 4B), and hole-like trenches 1510 are formed in said dedicated trenches 1505.

According to an embodiment of the present disclosure, the hole-like trenches 1510 are advantageously exploited for the removal of sacrificial dielectric layers and the replacement thereof with conductive material layers, like the previously described hole-like trenches 505.

Moreover, the dedicated trenches 1505 filled with dielectric material work as support structure that advantageously avoid the collapse of the remaining dielectric material layers of the access portion after the removal of the sacrificial layers.

FIG. 16 illustrates a diagram showing the steps of a method of the present disclosure. Several steps of a method 1600 for manufacturing a 3D vertical array of memory cells are depicted. Steps 1610-1680 may be carried out according to the description above with reference to FIGS. 2-13 and 14-15. Some details have been omitted in the diagram of method 1600 to avoid obfuscating the method flow. Method 1600 may comprise, at step 1610, forming on a substrate a stack of dielectric material layers comprising first and second dielectric material layers alternated to each other; at step 1620, forming holes through the stack of dielectric material layers, said holes exposing the substrate; at step 1630, selectively removing the second material layers through said holes to form cavities between adjacent first dielectric material layers; at step 1640, filling said cavities with a conductive material through said holes to form corresponding conductive material layers; at step 1650, forming first memory cell access lines from said conductive material layers; at step 1660, carrying out a conformal deposition of a chalcogenide material through said holes; at step 1670, forming memory cell storage elements from said deposed chalcogenide material; and, at step 1680, filling said holes with conductive material to form corresponding second memory cell access lines.

The previous description presents and discusses in detail several embodiments; nevertheless, several changes to the described embodiments, as well as different embodiments are possible, without departing from the scope defined by the appended claims.

The invention claimed is:

1. A method for manufacturing a 3D vertical array of memory cells, comprising:
    forming, on a substrate, a stack of dielectric material layers comprising alternating first and second dielectric material layers;
    forming a trench through the stack of dielectric material layers, the trench exposing the substrate;
    filling the trench with a third dielectric material;
    forming holes through the stack of dielectric material layers, the holes exposing the substrate, wherein forming the holes through the stack of dielectric material layers comprises forming the holes in the third dielectric material filling the trench;
    selectively removing the second dielectric material layers through the holes to form cavities between adjacent first dielectric material layers;
    filling the cavities with a conductive material through the holes to form corresponding conductive material layers;
    forming first memory cell access lines from the conductive material layers;
    carrying out a conformal deposition of a chalcogenide material through the holes;
    forming memory cell storage elements from the deposited chalcogenide material; and
    filling the holes with conductive material to form corresponding second memory cell access lines.

2. The method of claim 1, wherein selectively removing the second dielectric material layers through the holes comprises providing an etching agent through the holes.

3. The method of claim 1, wherein selectively removing the second dielectric material layers through the holes comprises performing a selective isotropic etching operation.

4. The method of claim 1, wherein forming the trench through the stack of dielectric material layers comprises performing a selective vertical etching operation.

5. The method of claim 1, wherein forming the holes in the third dielectric material filling the trench comprises performing a selective vertical etching operation.

6. The method of claim 1, wherein the substrate comprises the third dielectric material.

7. The method of claim 1, wherein forming the trench through the stack of dielectric material layers subdivides each second dielectric material layer in a corresponding first portion of the second dielectric material and a corresponding second portion of the second dielectric material, filling the cavities with a conductive material causing:
the replacement of each corresponding first portion of the second dielectric material layer with a corresponding first portion of conductive material layer, and
the replacement of each corresponding second portion of the second dielectric material layer with a corresponding second portion of conductive material layer.

8. The method of claim 7, wherein forming the first memory cell access lines from the conductive material layers comprises forming the first memory cell access lines from the corresponding first portion of the conductive material layer and the corresponding second portion of the conductive material layer.

9. The method of claim 1, further comprising:
forming a further trench through the stack of dielectric material layers in an access portion of the 3D vertical array of memory cells;
filling the further trench with the third dielectric material;
forming further holes in the third dielectric material filling the further trench;
selectively removing the second dielectric material layers in the access portion through the further holes to form further cavities between adjacent first dielectric material layers in the access portion; and
filling the further cavities with a conductive material through the further holes to form corresponding conductive material layers in the access portion.

10. The method of claim 1, further comprising forming a plurality of conductive contacts extending through the substrate, each conductive contact being associated to a respective second access memory line.

11. The method of claim 10, wherein forming the holes through the stack of dielectric material layers comprises forming holes at the conductive contacts to expose the conductive contacts.

12. The method of claim 11, wherein filling the holes with conductive material comprises contacting the conductive contacts with the conductive material.

13. A method for manufacturing a 3D vertical array of memory cells, comprising:
forming, on a substrate, a stack of dielectric material layers comprising alternating first and second dielectric material layers;
forming a trench through the stack of dielectric material layers, the trench exposing the substrate, and
filling the trench with a third dielectric material
forming holes through the stack of dielectric material layers, the holes exposing the substrate, wherein forming the holes through the stack of dielectric material layers comprises forming the holes in the third dielectric material filling the trench;
selectively removing the second dielectric material layers through the holes to form cavities between adjacent first dielectric material layers;
filling the cavities with a conductive material through the holes to form corresponding conductive material layers for forming a first access line to memory cells;
forming memory cell storage elements though recesses at the holes; and
filling the holes with conductive material to form corresponding second memory cell access lines.

14. The method of claim 13, further comprising forming a data storage element of a memory cell by recessing the conductive material layers at the holes and carrying out a conformal deposition of a chalcogenide material through the recesses at the holes in order to fill the recesses with the chalcogenide material.

15. The method of claim 14, wherein forming the plurality of recesses comprises performing an isotropic etching operation in sidewalls of the holes.

16. The method of claim 13, wherein the first dielectric material layer comprises silicon dioxide and the second dielectric material layer comprises silicon nitride.

* * * * *